United States Patent
Karyu et al.

(10) Patent No.: US 11,587,850 B2
(45) Date of Patent: Feb. 21, 2023

(54) SEMICONDUCTOR STORAGE DEVICE

(71) Applicant: Kioxia Corporation, Tokyo (JP)

(72) Inventors: Nozomi Karyu, Yokkaichi (JP); Genki Kawaguchi, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 182 days.

(21) Appl. No.: 17/199,601

(22) Filed: Mar. 12, 2021

(65) Prior Publication Data

US 2022/0084910 A1   Mar. 17, 2022

(30) Foreign Application Priority Data

Sep. 14, 2020 (JP) .............................. JP2020-153866

(51) Int. Cl.
| | | |
|---|---|---|
| H01L 23/48 | (2006.01) | |
| H01L 27/11582 | (2017.01) | |
| H01L 27/11565 | (2017.01) | |
| H01L 27/11575 | (2017.01) | |
| H01L 27/1157 | (2017.01) | |
| H01L 27/11524 | (2017.01) | |
| H01L 27/11556 | (2017.01) | |

(52) U.S. Cl.
CPC ...... *H01L 23/481* (2013.01); *H01L 27/11582* (2013.01)

(58) Field of Classification Search
CPC ............ H01L 23/481; H01L 27/11582; H01L 27/11565; H01L 27/11575; H01L 27/1157; H01L 27/11524; H01L 27/11556
See application file for complete search history.

(56) References Cited

U.S. PATENT DOCUMENTS

2017/0179154 A1   6/2017   Furihata et al.

*Primary Examiner* — Herve-Louis Y Assouman
(74) *Attorney, Agent, or Firm* — Oblon, McClelland, Maier & Neustadt, L.L.P.

(57) ABSTRACT

According to one embodiment, a semiconductor storage device includes: first and second plate-shaped portions which extend in a stacking direction of each layer of a first stacked body and a first direction intersecting the stacking direction and are arranged between the first stacked body and a second stacked body on both sides of the second stacked body in a second direction intersecting the stacking direction and the first direction; and an isolation layer that penetrates at least the uppermost conductive layer among a plurality of conductive layers and isolates the uppermost conductive layer in the second direction. The isolation layer extends in a portion of the first stacked body in the first direction toward the second stacked body, and is connected to a side surface of the first plate-shaped portion from a first region on an inner side of the first and second plate-shaped portions.

20 Claims, 11 Drawing Sheets

SEMICONDUCTOR STORAGE DEVICE

CROSS-REFERENCE TO RELATED APPLICATIONS

This application is based upon and claims the benefit of priority from Japanese Patent Application No. 2020-153866, filed on Sep. 14, 2020; the entire contents of which are incorporated herein by reference.

FIELD

Embodiments described herein relate generally to a semiconductor storage device.

BACKGROUND

In a three-dimensional non-volatile memory, for example, memory cells are arranged three-dimensionally in a stacked body in which a plurality of conductive layers are stacked. In order to make these memory cells function, some conductive layers among the plurality of conductive layers are sometimes isolated inside a layer and partitioned into several portions.

DETAILED DESCRIPTION

A semiconductor storage device according to an embodiment includes: a first stacked body in which a plurality of conductive layers are stacked with a first insulating layer interposed between the conductive layers; a second stacked body in which a plurality of second insulating layers are stacked with the first insulating layer interposed between the second insulating layers, the second stacked body being surrounded by the first stacked body when viewed from a stacking direction of each layer of the first stacked body; first and second plate-shaped portions which extend in the stacking direction and a first direction intersecting the stacking direction and are arranged between the first stacked body and the second stacked body on both sides of the second stacked body in a second direction intersecting the stacking direction and the first direction, respectively; a pillar which extends in the stacking direction inside the first stacked body at a position separated from the first and second plate-shaped portions in the first direction, and includes memory cells formed at intersections with at least some of the plurality of conductive layers; and an isolation layer that penetrates at least an uppermost conductive layer among the plurality of conductive layers and isolates the uppermost conductive layer in the second direction. The isolation layer extends in a portion of the first stacked body in the first direction toward the second stacked body, and is connected to a side surface of the first plate-shaped portion from a first region on an inner side of the first and second plate-shaped portions.

Hereinafter, the present invention will be described in detail with reference to the drawings. Incidentally, the present invention is not limited to the following embodiments. In addition, constituent elements in the following embodiments include those that can be easily assumed by those skilled in the art or those that are substantially the same.

Configuration Example of Semiconductor Storage Device

Figure 1A:
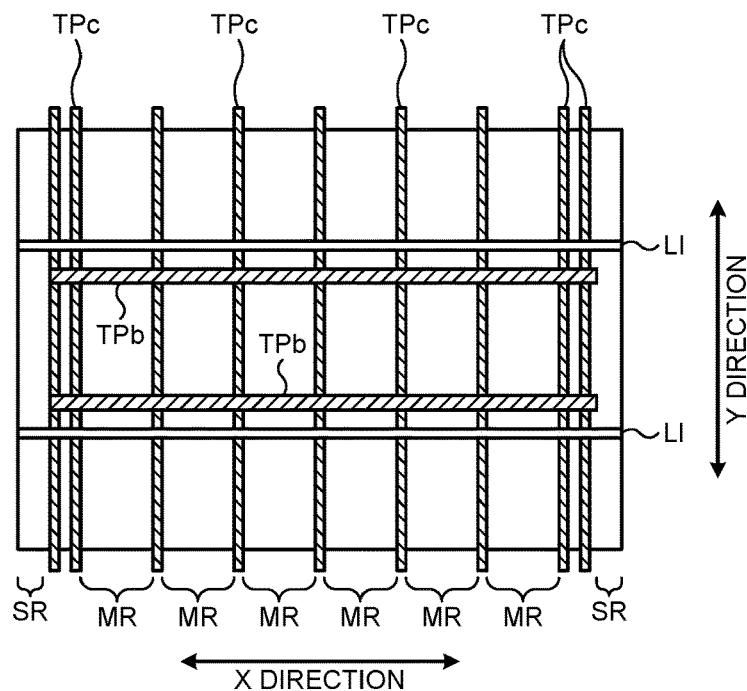
FIGS. 1A and 1B are views illustrating schematic configuration examples of a semiconductor storage device according to an embodiment.
Figure 1B:
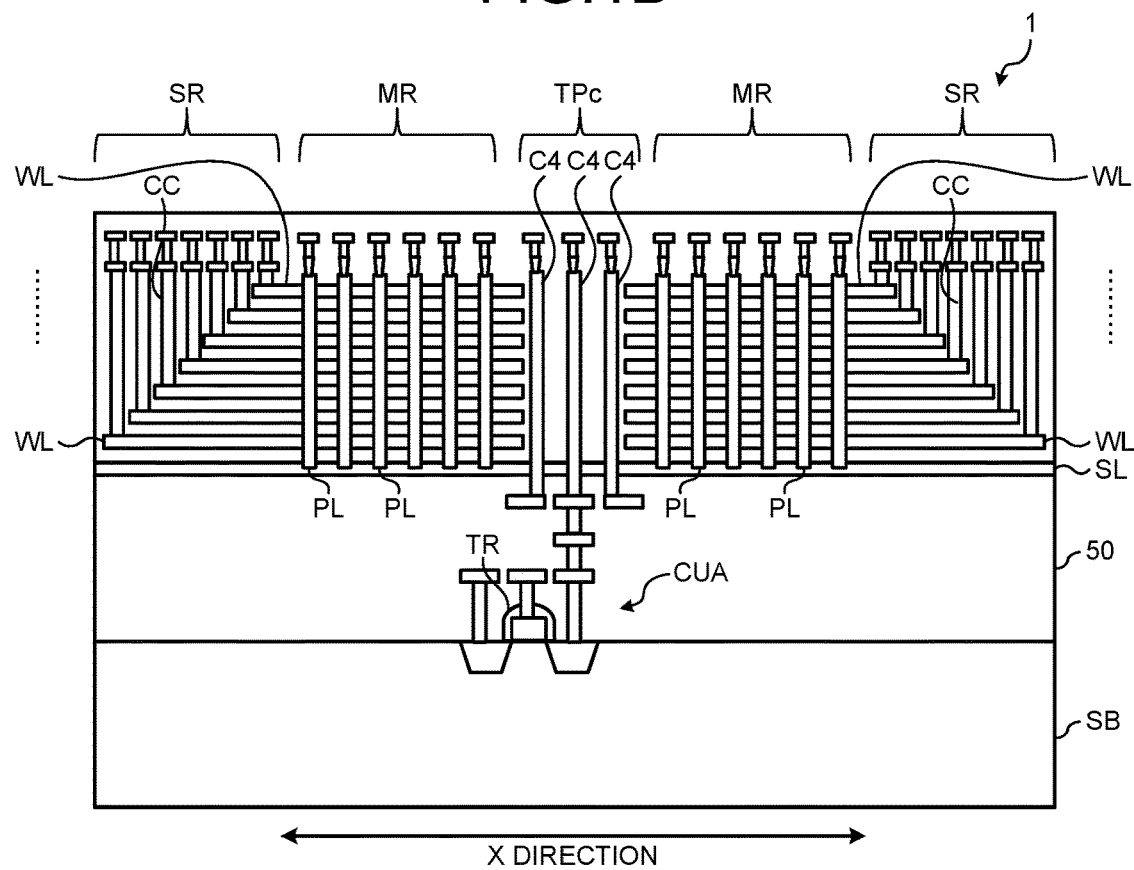

FIGS. 1A and 1B are views illustrating schematic configuration examples of a semiconductor storage device 1 according to an embodiment. FIG. 1A is a schematic plan view illustrating a layout of the semiconductor storage device 1, and FIG. 1B is a cross-sectional view of the semiconductor storage device 1 taken along the X direction. However, FIG. 1B does not illustrate hatching in consideration of the viewability of the drawing. In addition, FIGS. 1A and 1B do not illustrate some upper layer wirings.

Incidentally, in the present specification, both the X direction and the Y direction are directions along an orientation of a surface of a word line WL, which will be described later, and the X direction and the Y direction are orthogonal to each other. In addition, an electrical leading direction of the word line WL, which will be described later, is sometimes referred to as a first direction, and this first direction is a direction along the X direction. In addition, a direction intersecting the first direction is sometimes referred to as a second direction, and this second direction is a direction along the Y direction. However, the semiconductor storage device 1 may have a manufacturing difference, and thus, the first direction and the second direction are not necessarily orthogonal to each other.

As illustrated in FIGS. 1A and 1B, the semiconductor storage device 1 includes a peripheral circuit CUA, a memory region MR, through contact regions TPc and TPb, and a stepped region SR on a substrate SB.

The substrate SB is a semiconductor substrate, for example, a silicon substrate or the like. The peripheral circuit CUA including a transistor TR, a wiring, and the like is arranged on the substrate SB. The peripheral circuit CUA contributes to an operation of a memory cell to be described later.

The peripheral circuit CUA is covered with an insulating layer 50. A source line SL is arranged on the insulating layer 50. A plurality of the word lines WL are stacked above the source line SL.

The plurality of word lines WL are divided in the Y direction by a plurality of contacts LI. That is, each of the plurality of contacts LI has a longitudinal direction in the X direction along the surface of the word line WL, and penetrates the word line WL in a stacking direction.

Between the plurality of contacts LI, a plurality of the memory regions MR, a plurality of the through contact regions TPc and TPb, and stepped regions SR arranged at both ends of the word lines WL are arranged.

In the memory region MR as a second region, a plurality of pillars PL penetrating the word lines WL in the stacking direction are arranged. The plurality of memory cells are formed at intersections between the pillars PL and the word lines WL. As a result, the semiconductor storage device 1 is configured as, for example, a three-dimensional non-volatile memory in which the memory cells are three-dimensionally arranged in the memory region MR. A plug connecting the pillar PL and upper layer wirings such as a bit line is arranged in an upper end portion of the pillar PL.

The stepped region SR has a configuration in which the plurality of word lines WL are led out in a staircase pattern. Contacts CC that connect the word lines WL and the upper layer wirings and the like are arranged at individual terraces of the plurality of word lines WL led out on steps. Incidentally, a direction in which terrace surfaces of the respective steps of the stepped region SR face is defined as an upward direction in the present specification.

The plurality of through contact regions TPc as first regions are arranged among the plurality of memory regions MR side by side in the X direction between the two contacts LI as first and second structures, for example. FIG. 1B illustrates the through contact region TPc which is one of the through contact regions TPc and TPb. As illustrated in FIG. 1B, a contact C4 connecting the peripheral circuit CUA arranged on the substrate SB on the lower side and various upper layer wirings and the like is arranged in the through contact region TPc. The word line WL is not arranged in the periphery of the contact C4.

The plurality of through contact regions TPb extend in the X direction along the plurality of contacts LI, for example, at positions separated from the contacts LI. A contact (not illustrated), which connects the peripheral circuit CUA arranged on the substrate SB on the lower side and the upper layer wiring such as the bit line, is arranged in the through contact region TPb. Although not illustrated in FIG. 1B, it may be configured such that the word line WL is not arranged in the periphery of the contact in the through contact region TPb as in the contact C4.

As described above, various configurations such as the pillar PL are connected to the peripheral circuit CUA via the upper layer wiring by the plurality of through contact regions TPc and TPb.

Next, detailed configuration examples of the semiconductor storage device 1 will be described with reference to FIGS. 2A to 2C.

Figure 2A:
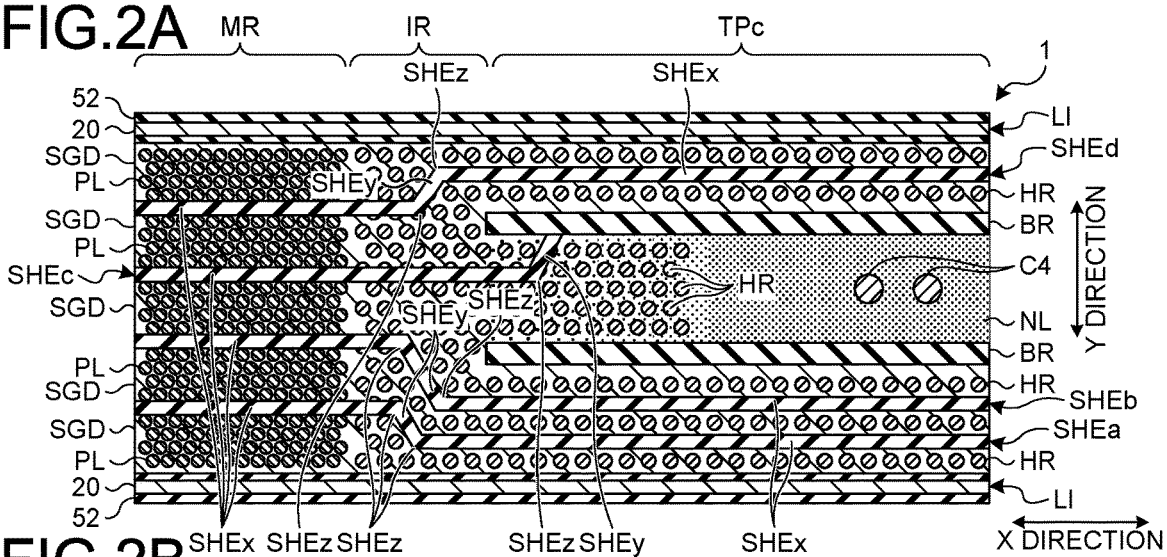
FIGS. 2A to 2C are views illustrating detailed configuration examples of the semiconductor storage device according to the embodiment.
Figure 2B:
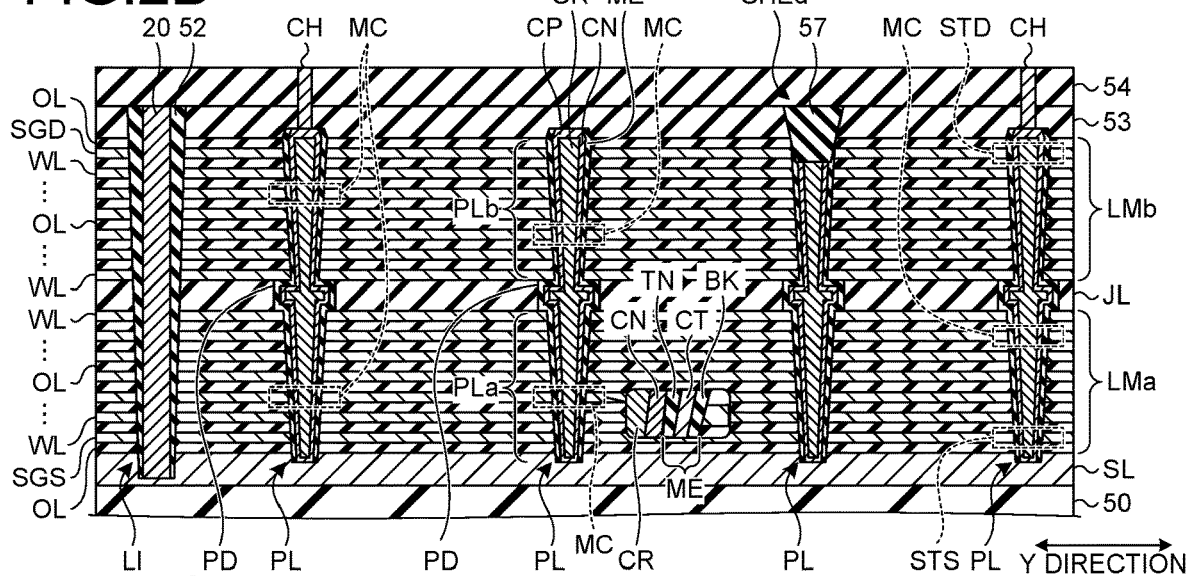
Figure 2C:
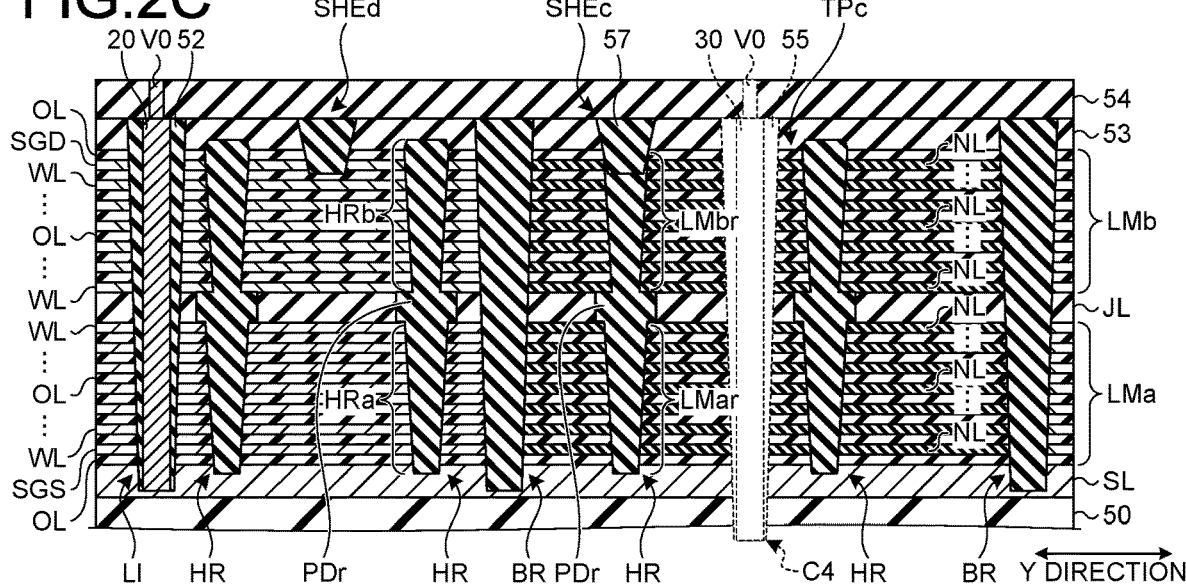

FIGS. 2A to 2C are views illustrating the detailed configuration examples of the semiconductor storage device 1 according to the embodiment. FIG. 2A is a cross-sectional view taken along a surface of a select gate line SGD of the semiconductor storage device 1 including the memory region MR and the through contact region TPc. FIG. 2B is a cross-sectional view of the memory region MR taken along the Y direction. FIG. 2C is a cross-sectional view of the through contact region TPc taken along the Y direction. However, FIGS. 2A to 2C do not illustrate a structure below the insulating layer 50, such as the substrate SB and the peripheral circuit CUA, the upper layer wiring, and the like.

As illustrated in FIGS. 2A to 2C, the semiconductor storage device 1 includes, for example, stacked bodies LMa and LMb, which are arranged on the source line SL, an insulating layer 53 covering the stacked bodies LMa and LMb, and an insulating layer 54 covering the insulating layer 53. The source line SL is, for example, a polysilicon layer.

The stacked bodies LMa and LMb as the first stacked bodies have a configuration in which a plurality of conductive layers, such as a tungsten layer and a molybdenum layer, and the first insulating layers, such as a $SiO_2$ layer, are alternately stacked one by one.

The stacked body LMa is arranged on the source line SL and has a select gate line SGS as the lowermost conductive layer, and the word lines WL as the other conductive layers. Insulating layers OL as the first insulating layers are arranged among the select gate line SGS and the individual word lines WL.

The stacked body LMb is arranged on the stacked body LMa via a junction layer JL, such as a $SiO_2$ layer, and has the select gate line SGD as the uppermost conductive layer and the word lines WL as the other conductive layers. The insulating layers OL as the first insulating layers are arranged among the select gate line SGD and the individual word lines WL.

Incidentally, in the examples of FIGS. 2B and 2C, each of the stacked bodies LMa and LMb has one layer of the select gate line SGS or SGD and six layers of the word lines WL, but the number of the select gate lines SGS and SGD and the word lines WL is arbitrary.

The stacked bodies LMa and LMb include the plurality of memory regions MR in which a plurality of the memory cells MC are arranged three-dimensionally and the stepped regions SR in which the word lines WL of the respective layers are formed in a staircase pattern at both the ends of the stacked bodies LMa and LMb (see FIG. 1B). In addition, the stacked bodies LMa and LMb include the plurality of through contact regions TPc including stacked bodies LMar and LMbr sandwiched between two plate-shaped portions BR on both sides in the Y direction, and an intermediate region IR arranged between the through contact region TPc and the memory region MR.

The stacked bodies LMa and LMb are divided by the contact LI extending along the X direction. In a region sandwiched between the two contacts LI, the memory region MR, the through contact region TPc, the intermediate region IR, and the stepped region SR form a region called a block.

The contact LI as a dividing portion penetrates the insulating layer 53, the stacked bodies LMa and LMb, and the junction layer JL in the stacking direction of the stacked bodies LMa and LMb and reaches the source line SL. Each of the contacts LI has an insulating layer 52 covering a side wall of the contact LI. The inner side of the insulating layer 52 is filled with a conductive layer 20. The insulating layer 52 is, for example, a $SiO_2$ layer or the like. The conductive layer 20 is, for example, a polysilicon layer or a tungsten layer. The conductive layer 20 of the contact LI is connected to the upper layer wiring via a plug VO penetrating the insulating layer 54.

Since each of the contacts LI has the conductive layer 20 connected to the plug VO and is placed on the source line SL, the contact LI functions, for example, as a source line contact. However, instead of the contact LI, a structure as a dividing portion filled with an insulating layer, such as a SiO₂ layer may divide the stacked bodies LMa and LMb in the Y direction.

Between the two contacts LI, a plurality of isolation layers SHEa to SHEd having a longitudinal direction approximately along the longitudinal direction of the contact LI and penetrating the select gate lines SGD of the stacked body LMb and the insulating layer 53 are arranged. The isolation layers SHEa to SHEd are filled with insulating layers 57, such as SiO₂ layers, and partition the uppermost conductive layer of the stacked body LMb into the plurality of select gate lines SGD between the two contacts LI.

However, the plurality of isolation layers SHEa to SHEd may penetrate the plurality of conductive layers including the uppermost conductive layer. In this case, the plurality of conductive layers through which the plurality of isolation layers SHEa to SHEd penetrate are partitioned as the select gate lines SGD.

As illustrated in FIG. 2A, among the plurality of isolation layers SHEa to SHEd, the isolation layers SHEa, SHEb, and SHEd excluding the isolation layer SHEc include portions SHEx extending along the X direction in the memory region MR and the through contact region TPc, and portions SHEy extending to the stacked bodies LMa and LMb surrounding the outer side of the stacked bodies LMar and LMbr while avoiding the stacked bodies LMar and LMbr to be described later.

The portion SHEy is arranged in the intermediate region IR and has bent portions SHEz at both ends connected to the portion SHEx in the memory region MR and the portion SHEx in the through contact region TPc, respectively. Each angle at the bent portion SHEz formed by the portion SHEx and the portion SHEy is, for example, an obtuse angle.

Among the plurality of isolation layers SHEa to SHEd, the isolation layer SHEc extends along the X direction toward the stacked bodies LMar and LMbr, and is connected to a side surface of one plate-shaped portion BR from an inner region of the two plate-shaped portions BR to be described later. That is, the isolation layer SHEc is connected to a surface of the one plate-shaped portion BR between the two plate-shaped portions BR facing each other, the surface opposing the other plate-shaped portion BR.

A connection position between the isolation layer SHEc and the plate-shaped portion BR is a portion, for example, from one end of the plate-shaped portion BR to the vicinity of the center of the plate-shaped portion BR in the X direction. The contact C4 is arranged between the two plate-shaped portions BR in the vicinity of the centers in the X direction as will be described later. Therefore, the connection position between the isolation layer SHEc and the plate-shaped portion BR can be arranged, for example, from one end of the plate-shaped portion BR to a position of the contact C4 in the X direction.

The isolation layer SHEc includes a portion SHEx as a first portion extending along the X direction at a position between the two plate-shaped portions BR in the Y direction in the memory region MR and the intermediate region IR, and a portion SHEy as a second portion extending toward the one plate-shaped portion BR inside the inner region of the two plate-shaped portions BR.

The portion SHEy in the isolation layer SHEc in this manner has a bent portion SHEz arranged in the through contact region TPc and connected to the portion SHEx at one end, and has the other end connected to the side surface of the plate-shaped portion BR. An angle at the bent portion SHEz formed by the portion SHEx and the portion SHEy is, for example, an obtuse angle. In addition, the portion SHEy is connected to the surface of the plate-shaped portion BR to be inclined with respect to the plate-shaped portion BR extending along the X direction. Therefore, an angle at which the portion SHEy is connected to the side surface of the plate-shaped portion BR is, for example, an acute angle smaller than the right angle. However, a layout may be adopted in which the bent portion SHEz of the isolation layer SHEc is not arranged in the inner region of the two plate-shaped portions BR but is arranged in the intermediate region IR similarly to the bent portions SHEz at both the ends of the portions SHEy in the other isolation layers SHEa, SHEb, and SHEd.

Incidentally, the memory region MR is further arranged on the right side of the paper surface of the through contact region TPc illustrated in FIG. 2A with the intermediate region IR interposed therebetween, and the portions SHEx in the isolation layers SHEa, SHEb, and SHEd further extend to this memory region MR via the portions SHEy arranged in the intermediate region IR. In addition, the portion SHEy of another isolation layer SHEc is connected to the vicinity of the other end on the right side of the paper surface of the plate-shaped portion BR illustrated in FIG. 2A, and the portion SHEx of this isolation layer SHEc further extends to the memory region MR ahead. In this manner, the isolation layers SHEa to SHEd have a line-symmetrical shape in both directions while sandwiching the through contact region TPc.

As a result, each of the isolation layers SHEa to SHEd isolates the uppermost conductive layer of the stacked body LMb in the Y direction. That is, between the two contacts LI, the uppermost conductive layer of the stacked body LMb is isolated into the select gate line SGD partitioned by the contact LI and the isolation layer SHEa, the select gate line SGD partitioned by the isolation layer SHEa and the isolation layer SHEb, the select gate line SGD partitioned by the isolation layer SHEb, the isolation layer SHEc and the plate-shaped portion BR and including the stacked bodies LMar and LMbr, the select gate line SGD partitioned by the isolation layer SHEc, the plate-shaped portion BR and the isolation layer SHEd, and the select gate line SGD partitioned by the isolation layer SHEd and the other contact LI.

Incidentally, hereinafter, the isolation layers SHEa to SHEd are simply described as the isolation layer SHE when not distinguished.

As illustrated in FIGS. 2A and 2B, the plurality of pillars PL are arranged in a matrix in the stacked bodies LMa and LMb between the two contacts LI in the memory region MR. Each of the pillars PL penetrates the stacked bodies LMa and LMb and the junction layer JL from the lower part of the insulating layer 53 in the stacking direction of the stacked bodies LMa and LMb, and reaches the source line SL.

The pillar PL has a shape in which a pillar PLa penetrating the stacked body LMa and a pillar PLb penetrating the stacked body LMb are joined at a height position of the junction layer JL. The pillars PLa and PLb sometimes have, for example, a tapered shape in which a diameter of a bottom surface is narrower than a diameter of a top surface, or a bowing shape in which a diameter is widened at a predetermined height position between a top surface and a bottom surface.

Each of the pillars PL has a pedestal PD at a joining portion in the junction layer JL. The pedestal PD has a larger diameter than a top surface of the pillar PLa arranged in the stacked body LMa. In addition, each of the pillars PL has a cap layer CP in an upper end portion of the pillar PLb. The cap layer CP has a diameter about an outer diameter of a core layer CR of the pillar PL, which will be described later, and covers at least a part of the top surface of the pillar PL.

Each of the pillars PLa and PLb and the pedestal PD has a memory layer ME, a channel layer CN, and the core layer CR in this order from the outer peripheral side of each of the pillars PLa and PLb and the pedestal PD. The channel layer CN is also arranged at the bottom of the pillar PLa, is connected to the source line SL, and is also connected to the above-described cap layer CP. The memory layer ME is a layer in which a block insulating layer BK, a charge storage layer CT, and a tunnel insulating layer TN are stacked in this order from the outer peripheral side of each of the pillars PLa and PLb and the pedestal PD.

The block insulating layer BK, the tunnel insulating layer TN, and the core layer CR are, for example, $SiO_2$ layers or the like. The charge storage layer CT is, for example, a SiN layer or the like. The channel layer CN and the cap layer CP are, for example, an amorphous silicon layer, a polysilicon layer, or the like.

The cap layer CP of the pillar PL is connected to the upper layer wiring such as the bit line via a plug CH penetrating the insulating layers 53 and 54. Since each of the pillars PL has the memory layer ME and the channel layer CN, the plurality of memory cells MC are formed at the respective intersections between the pillars PL and the word lines WL. In addition, select gates STS and STD are formed at intersections between the pillar PL and each of the select gate lines SGS and SGD, respectively.

The memory cell MC stores data by holding and so on a charge in the charge storage layer CT. As a predetermined voltage is applied from a predetermined word line WL to a memory cell MC at a height position of the word line WL, data is written to and read from the memory cell MC. The select gates STS and STD are turned on or off by applying a predetermined voltage from the select gate lines SGS and SGD at height positions of the select gates STS and STD, thereby turning the memory cell MC of the pillar PL to which those select gates STS and STD belong into a selected state or a non-selected state.

Incidentally, the isolation layers SHE are arranged above some pillars PL among the plurality of pillars PL arrayed between the two contacts LI, the upper end portions of those pillars PL disappear, and the plug CH is not connected. Such pillars PL are arranged to maintain a regular array of the plurality of pillars PL. No memory cell and select gate are formed on side surfaces of the pillars PL, or functions of those memory cell and select gate are not valid.

As illustrated in FIGS. 2A and 2C, the through contact region TPc includes the stacked bodies LMar and LMbr surrounded by the stacked layers LMa and LMb and having insulating layers NL, instead of the word lines WL in the stacked bodies LMa and LMb.

That is, the stacked bodies LMar and LMbr as the second stacked bodies have a configuration in which the plurality of insulating layers OL and the insulating layers NL as the second insulating layers are alternately stacked. The insulating layer NL is, for example, a SiN layer or the like.

The number of layers and height positions of the insulating layers NL constituting each of the stacked bodies LMar and LMbr are equal to the number of layers and height positions of the conductive layers such as the word lines WL or the like constituting each of the stacked bodies LMa and LMb. The number of layers and height positions of the insulating layers OL constituting each of the stacked bodies LMar and LMbr are equal to the number of layers and height positions of the insulating layers OL constituting each of the stacked bodies LMa and LMb. The junction layer JL is interposed between the stacked bodies LMar and LMbr at a height position equal to that of the junction layer JL between the stacked bodies LMa and LMb.

In the stacked bodies LMar and LMbr, the contact C4 penetrating the insulating layer 53, the stacked bodies LMar and LMbr, the junction layer JL, and the source line SL in the stacking direction is arranged. As a result, the contact C4 is electrically connected to the transistor TR included in the peripheral circuit CUA (see FIG. 1B) on the substrate SB. Although the contact C4 is not arranged in a section illustrated in FIG. 2C, the contact C4 is illustrated by a broken line for convenience of the description.

The contact C4 has an insulating layer 55 that covers a side wall of the contact C4, and a conductive layer 30 filled the inner side of the insulating layer 55. The insulating layer 55 is, for example, a $SiO_2$ layer or the like. The conductive layer 30 is, for example, a tungsten layer or the like. The conductive layer 30 of the contact C4 is connected to the upper layer wiring via the plug VO penetrating the insulating layer 54. In this manner, the contact C4 electrically connects the respective structures arranged on both sides of the stacked bodies LMar and LMbr in the stacking direction.

Since the stacked bodies LMar and LMbr are mainly constituted by the insulating layers NL and OL, it is possible to suppress conduction and generation of a leakage current between the contact C4 and the stacked bodies LMa and LMb surrounding the periphery of the stacked bodies LMar and LMbr with the word line WL or the like, even if the contact C4 is arranged so as to penetrate the stacked bodies LMar and LMbr.

In addition, there is a case where a plurality of the contacts C4 are arranged side by side in the stacked bodies LMar and LMbr. Even in such a case, it is possible to suppress the conduction and the generation of the leakage current among the plurality of contacts C4 by arranging the plurality of contacts C4 in the stacked bodies LMar and LMbr constituted by the insulating layers NL and OL.

Since the contact C4 has a liner of the insulating layer 55 in the periphery of the conductive layer 30, the conduction and the generation of the leakage current among the word line WL and the plurality of contacts C4 are further suppressed.

The plate-shaped portions BR extending along the X direction are arranged on both sides of the stacked bodies LMar and LMbr in the Y direction. That is, the stacked bodies LMa and LMb surrounding the periphery of the stacked bodies LMar and LMbr are separated from the stacked bodies LMar and LMbr by the plate-shaped portions BR at least in the Y direction.

On the other hand, the stacked bodies LMa and LMb and the stacked bodies LMar and LMbr are in direct contact with each other in the X direction. A boundary between the stacked bodies LMa and LMb and the stacked bodies LMar and LMbr in the X direction is located, for example, from one end of the plate-shaped portion BR in the X direction to the arrangement position of the contact C4 in the X direction. The boundary between the stacked bodies LMa and LMb and the stacked bodies LMar and LMbr in the X direction may be located closer to the contact C4 than the bent portion SHEz of the isolation layer SHEc. The boundary between the stacked bodies LMa and LMb and the stacked bodies LMar and LMbr in the X direction may be located closer to the contact C4 than the connection position between the isolation layer SHEc and the plate-shaped portion BR.

That is, the boundary between the stacked bodies LMa and LMb and the stacked bodies LMar and LMbr in the X direction is not arranged closer to the center of the plate-shaped portion BR than the arrangement position of the contact C4 in the X direction, and keeps a predetermined distance from the contact C4.

In addition, the stacked bodies LMa and LMb and the stacked bodies LMar and LMbr do not necessarily have a clear boundary in the X direction. That is, the boundary between the stacked bodies LMa and LMb and the stacked bodies LMar and LMbr may be configured such that a ratio of conductive members such as tungsten forming the word lines WL of the stacked bodies LMa and LMb gradually decreases and a ratio of insulating members such as SiN constituting the insulating layers NL of the stacked bodies LMa and LMb gradually increases, for example, from the stacked bodies LMa and LMb to the stacked bodies LMar and LMbr.

The plate-shaped portions BR as the first and second plate-shaped portions penetrate the insulating layer 53, the boundary portion between the stacked bodies LMa and LMb and the stacked bodies LMar and LMbr, and the junction layer JL in the stacking direction of the stacked bodies LMa and LMb to reach the source line SL. The inside of the plate-shaped portion BR is filled with, for example, the insulating layer. As will be described later, the plate-shaped portion BR inhibits the replacement of the insulating layer NL with a conductive layer such as the word line WL or the like, which is carried out in a manufacturing process of the semiconductor storage device 1, in a region between the two plate-shaped portions BR.

A plurality of columnar portions HR are arranged in a matrix in the through contact region TPc and the intermediate region IR. That is, the columnar portion HR is arranged between the contact LI and the plate-shaped portion BR and between the two plate-shaped portions BR, in the through contact region TPc. In addition, the columnar portion HR is arranged between the two contacts LI in the intermediate region IR.

The columnar portion HR penetrates the stacked bodies LMa and LMb and the junction layer JL from the lower part of the insulating layer 53 in the stacking direction of the stacked bodies LMa and LMb, and reaches the source line SL. A part of the columnar portion HR arranged between the two plate-shaped portions BR may penetrate the boundary portion between the stacked bodies LMa and LMb and the stacked bodies LMar and LMbr in the X direction, or the inside of the stacked bodies LMar and LMbr.

More specifically, the columnar portion HR has a shape in which a columnar portion HRa penetrating the stacked body LMa or the stacked body LMar and a columnar portion HRb penetrating the stacked body LMb or the stacked body LMbr are joined at the height position of the junction layer JL. An upper end of the columnar portion HRb protrudes to the lower part of the insulating layer 53. The columnar portions HRa and HRb sometimes have, for example, a tapered shape in which a diameter of a bottom surface is narrower than a diameter of a top surface, or a bowing shape in which a diameter is widened at a predetermined height position between a top surface and a bottom surface.

Each of the columnar portions HR has a pedestal PDr at a joining portion in the junction layer JL. The pedestal PDr has a larger diameter than a top surface of the columnar portion HRa arranged in the stacked body LMa or the stacked body LMar.

The columnar portions HRa and HRb and the pedestal PDr are filled with an insulating layer as an insulating material. The insulating layer is, for example, a SiO$_2$ layer or the like.

However, there is a case where the isolation layer SHE is arranged above some of the columnar portions HR among the plurality of columnar portions HR arrayed between the two contacts LI. An upper end portion of such a columnar portion HR disappears due to the arrangement of the isolation layer SHE.

Incidentally, the columnar portion HR may be arranged in the stepped region SR (see FIG. 1B). The columnar portion HR supports a stacked structure of the semiconductor storage device 1 in the middle of manufacturing in the through contact region TPc, the intermediate region IR, and the stepped region SR in the manufacturing process of the semiconductor storage device 1 which will be described later.

(Method for Manufacturing Semiconductor Storage Device)

Next, an example of a method for manufacturing the semiconductor storage device 1 according to the embodiment will be described with reference to FIGS. 3A to 11C.

FIGS. 3A to 11C are views illustrating examples of a procedure of a method for manufacturing the semiconductor storage device 1 according to the embodiment. A, B and C in the same drawing number in FIGS. 3A to 11C indicate different sections in the same processing step. A in FIGS. 3A to 11C corresponds to the site in FIG. 2A, B corresponds to the site in FIGS. 2B, and C corresponds to the site in FIG. 2C.

Hereinafter, a description will start from a state after the peripheral circuit CUA including the transistor TR is formed on the substrate SB and the peripheral circuit CUA is covered with the insulating layer 50.

Figure 3A:
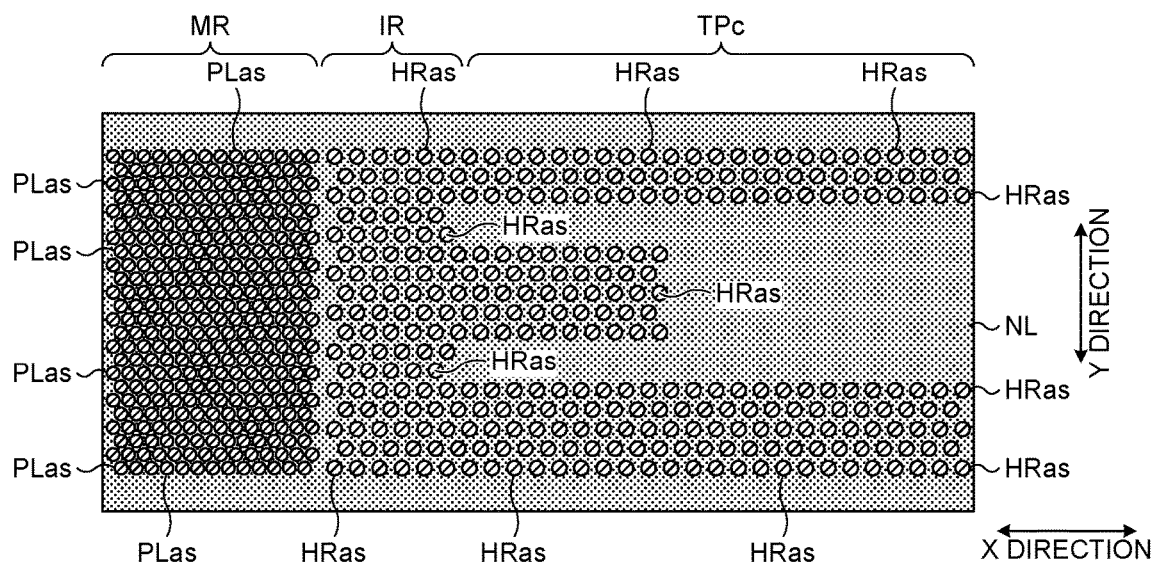
FIGS. 3A to 3C are views illustrating examples of a procedure of a method for manufacturing the semiconductor storage device according to the embodiment.
Figure 3B:
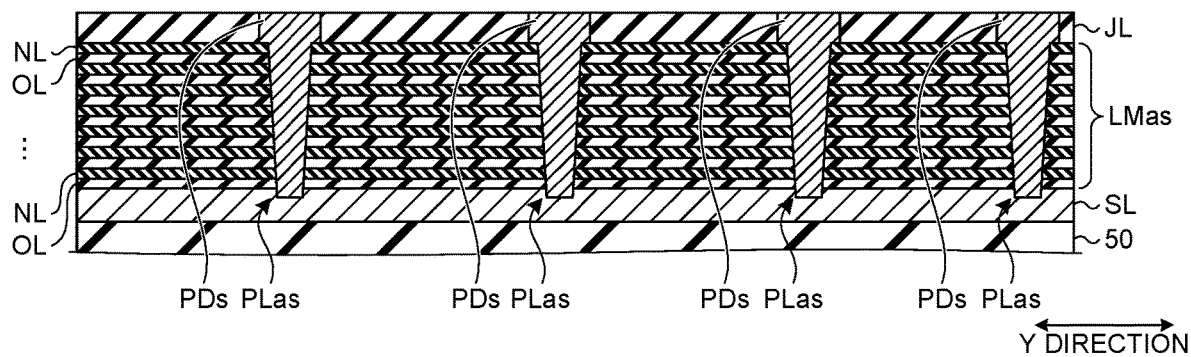
Figure 3C:
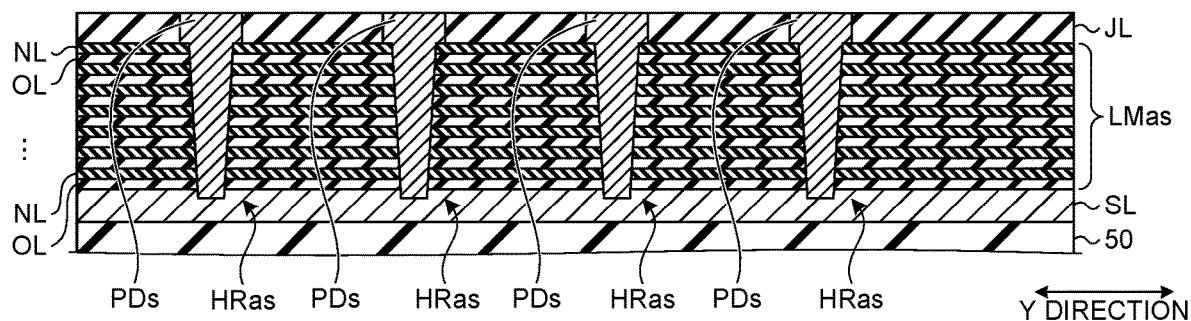

As illustrated in FIGS. 3A to 3C, the source line SL is formed on the insulating layer 50, and a stacked body LMas in which the plurality of insulating layers NL and insulating layers OL are alternately stacked is formed on the source line SL. The insulating layer NL as a sacrificial layer is, for example, a SiN layer or the like, and is to be replaced with a conductive material later to form a conductive layer such as the word line WL or the like. The junction layer JL is formed on the stacked body LMas.

As illustrated in FIGS. 3A and 3B, a memory hole, which penetrates the junction layer JL and the stacked body LMas, reaches the source line SL, and has an upper end increased in diameter, is formed in the memory region MR of the stacked body LMas, and the memory hole is filled with a sacrificial layer such as an amorphous silicon layer. As a result, a pillar PLas with a pedestal PDs having the diameter-increased portion at the upper end of the memory hole is formed.

As illustrated in FIGS. 3A and 3C, a hole, which penetrates the junction layer JL and the stacked body LMas, reaches the source line SL, and has an upper end increased in diameter, is formed in the through contact region TPc and intermediate region IR of the stacked body LMas, and the hole is filled with a sacrificial layer such as an amorphous silicon layer. As a result, a columnar portion HRas with the pedestal PDs having the diameter-increased portion at the upper end of the hole is formed.

Incidentally, a part of the stepped region SR is formed in the stacked body LMas at the timing when the stacked body LMas is formed although not illustrated in FIGS. 3A to 2C. In addition, the columnar portion HRas is also formed in the stepped region SR in parallel with the formation of the columnar portion HRas in the through contact region TPc and the like.

Figure 4A:
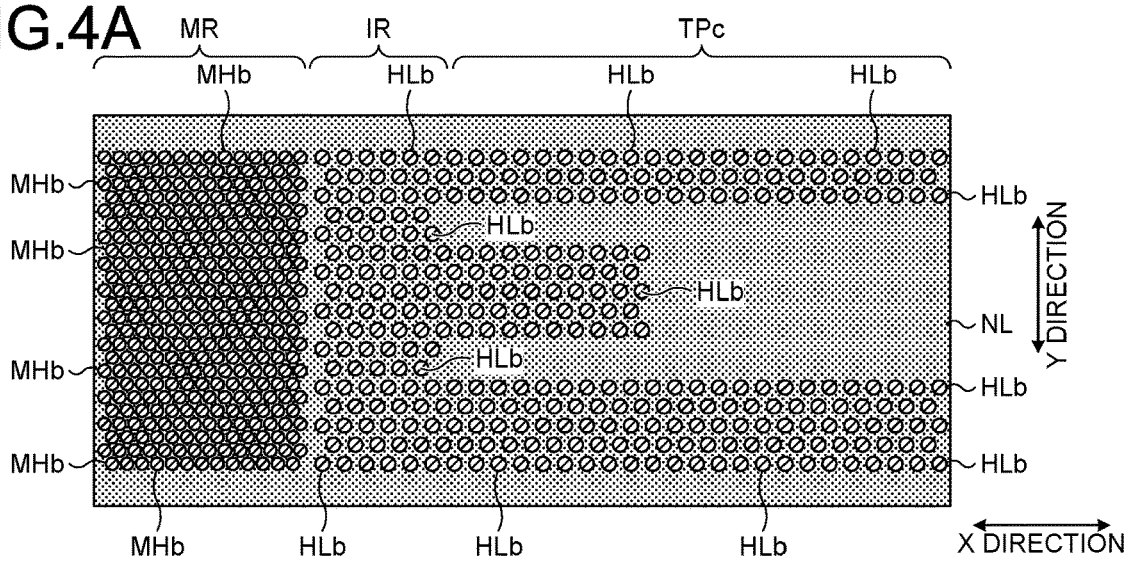
FIGS. 4A to 4C are views illustrating examples of the procedure of the method for manufacturing the semiconductor storage device according to the embodiment.
Figure 4B:
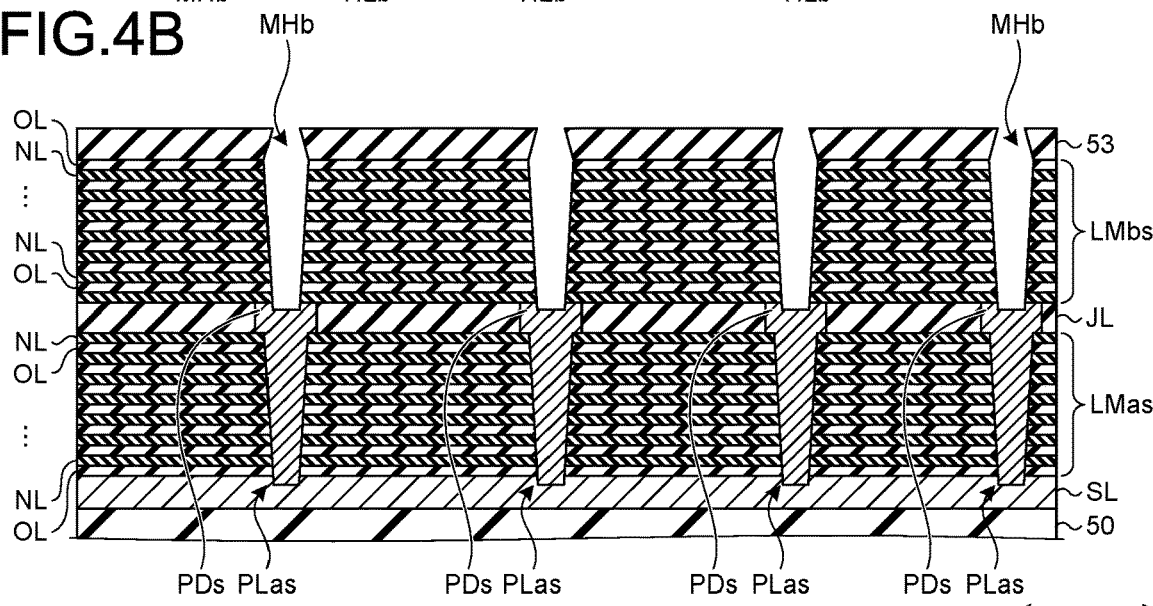
Figure 4C:
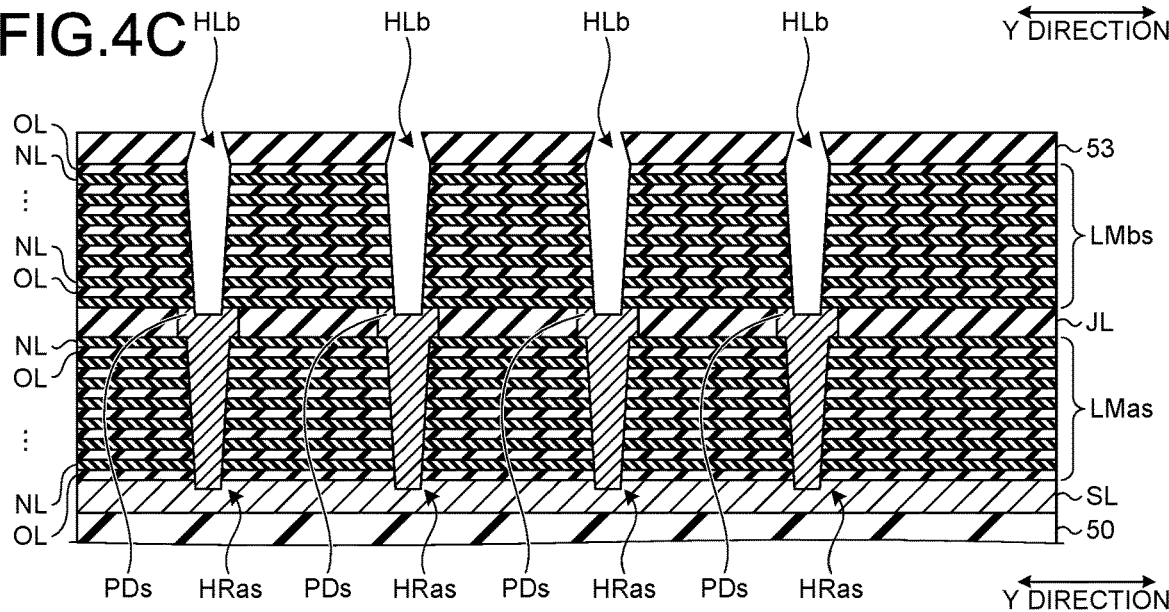

As illustrated in FIGS. 4A to 4C, a stacked body LMbs in which the plurality of insulating layers NL and insulating layers OL are alternately stacked is formed in an upper layer of each portion. The insulating layer 53 covering each portion is formed on the stacked body LMbs.

As illustrated in FIGS. 4A and 4B, memory holes MHb, which penetrate the insulating layer 53 and the stacked body LMb and are connected to the respective pedestals PDs of the junction layer JL, are formed.

On a top surface of the pillar PLas, the pedestal PDs having a larger diameter than the pillar PLas in the stacked body LMas is arranged. As a result, at the time of forming the memory hole MHb in the stacked body LMbs, the memory hole MHb and the pillar PLas can be connected via the pedestal PDs even if an arrangement position of the pillar PLas and an arrangement position of the memory hole MHb do not completely match each other in the vertical direction due to misalignment or the like.

As illustrated in FIGS. 4A and 4C, holes HLb, which penetrate the insulating layer 53 and the stacked body LMb and are connected to the respective pedestals PDs of the columnar portions HRas, are formed.

On a top surface of the columnar portion HRas, the pedestal PDs having a larger diameter than the columnar portion HRas in the stacked body LMas is arranged. As a result, at the time of forming the hole HLb in the stacked body LMbs, the hole HLb and the columnar portion HRas can be connected via the pedestal PDs even if an arrangement position of the columnar portion HRas and an arrangement position of the hole HLb do not completely match each other in the vertical direction due to misalignment or the like.

Incidentally, the remaining part of the stepped region SR is formed in the stacked body LMbs at the timing when the stacked body LMbs is formed although not illustrated in FIGS. 4A to 4C. In addition, the hole HLb is also formed in the stepped region SR in parallel with the formation of the hole HLb in the through contact region TPc and the like.

Figure 5A:
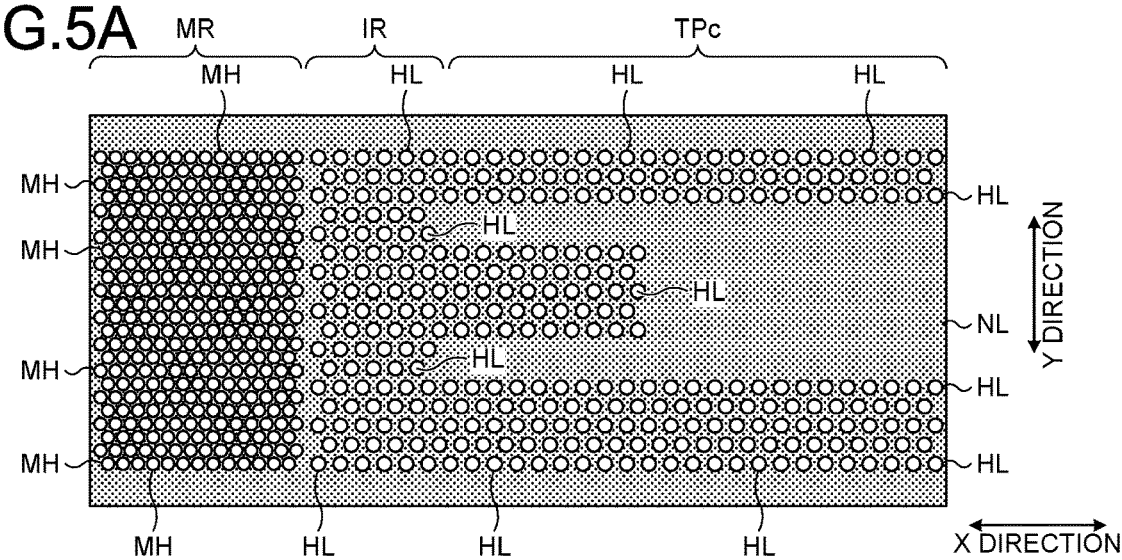
FIGS. 5A to 5C are views illustrating examples of the procedure of the method for manufacturing the semiconductor storage device according to the embodiment.
Figure 5B:
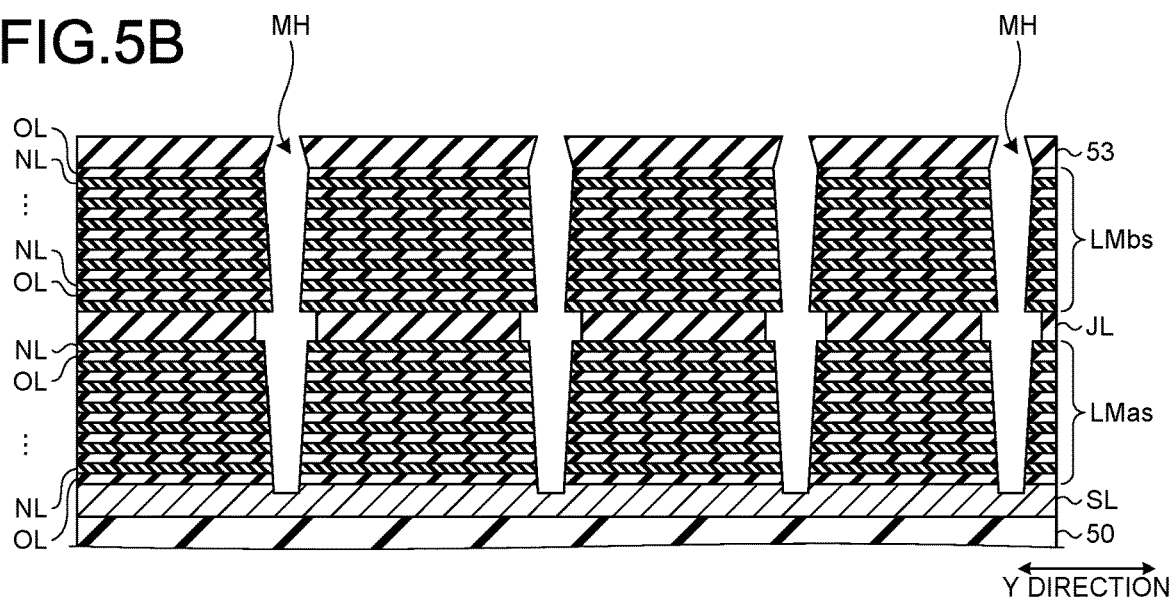

As illustrated in FIGS. 5A and 5B, the sacrificial layer of the pillar PLas is removed through the memory hole MHb described above to form a memory hole MH that penetrates the stacked body LMbs, the junction layer JL, and the stacked body LMas and reaches the source line SL.

Figure 5C:
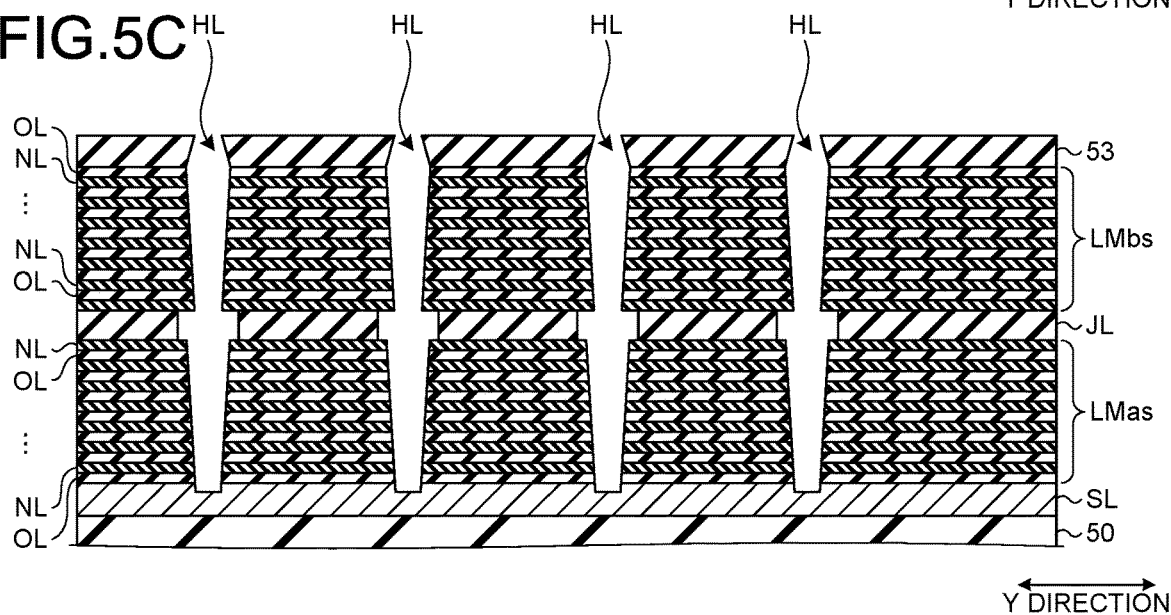

As illustrated in FIGS. 5A and 5C, the sacrificial layer of the columnar portion HRas is removed through the holes HLb described above. As a result, a hole HL, which penetrates the stacked body LMbs, the junction layer JL, and the stacked body LMas and reaches the source line SL, is formed. Incidentally, the hole HL is formed in the stepped region SR through the same process although not illustrated in FIGS. 5A to 5C.

Figure 6A:
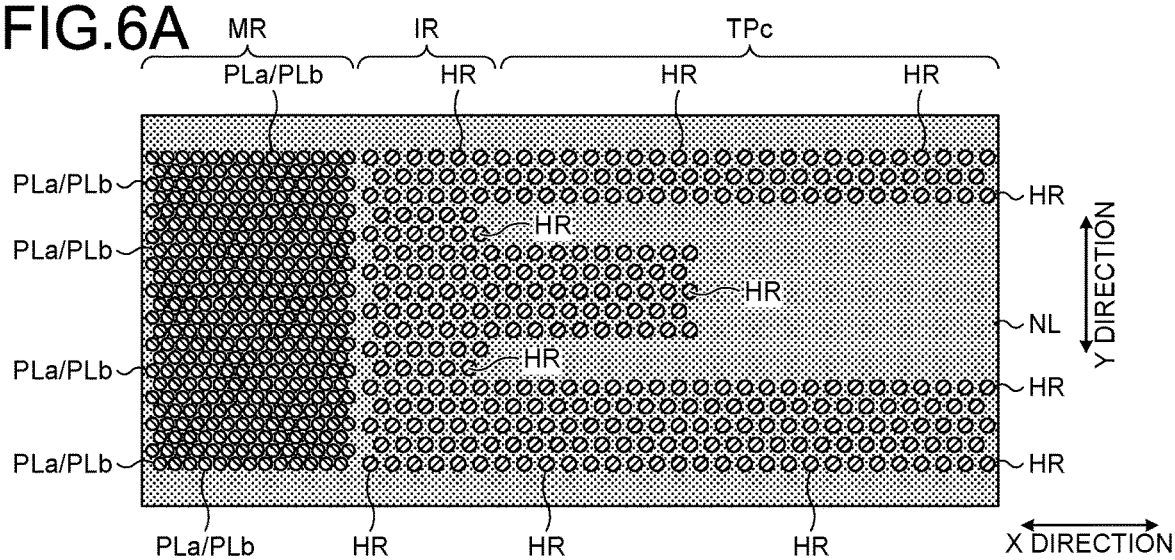
FIGS. 6A to 6C are views illustrating examples of the procedure of the method for manufacturing the semiconductor storage device according to the embodiment.
Figure 6B:
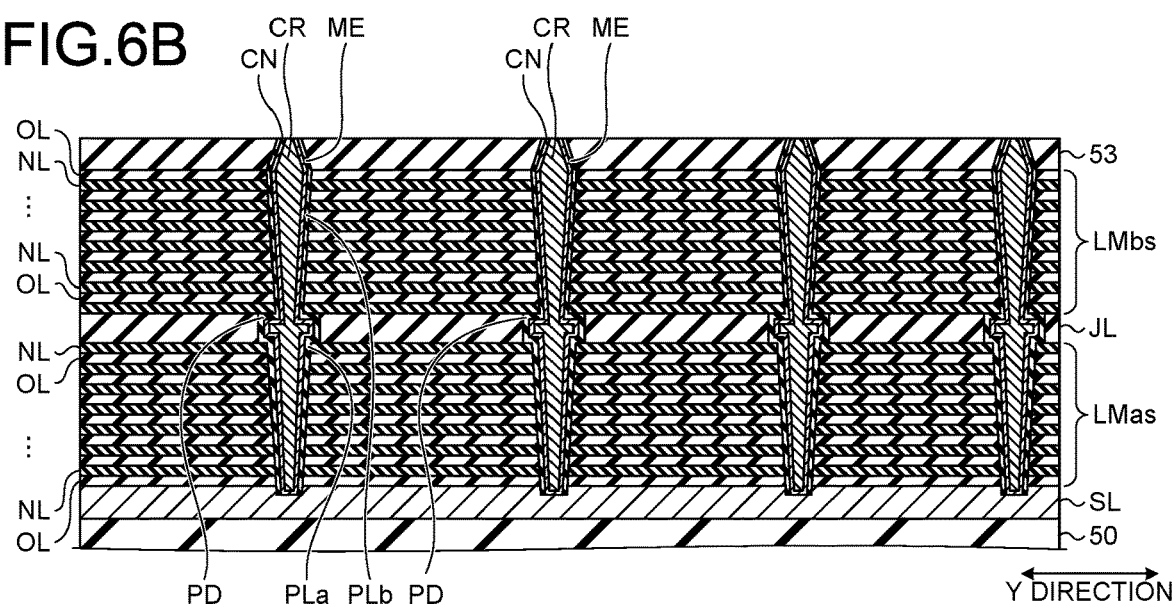
Figure 6C:
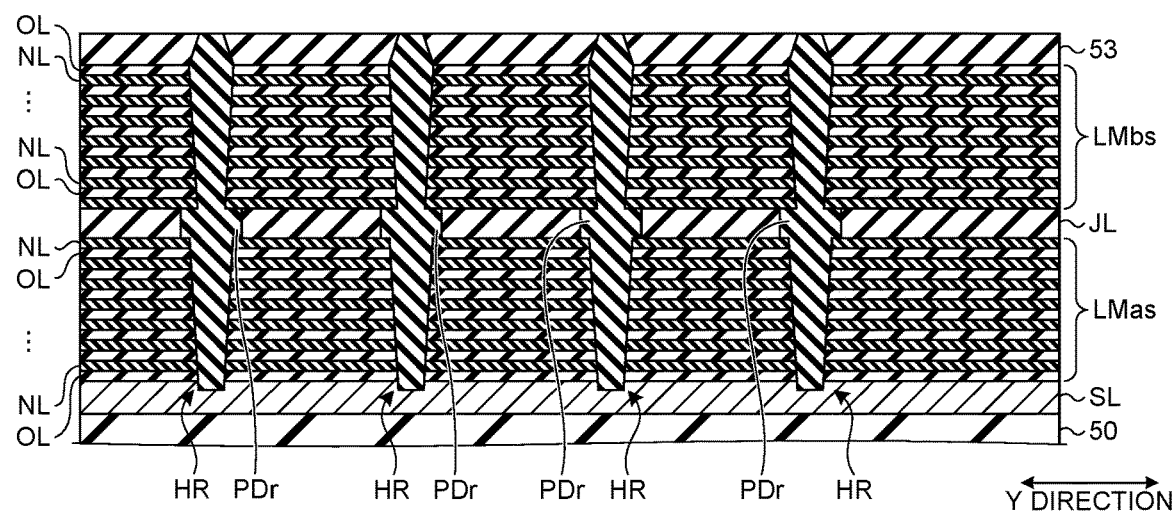

As illustrated in FIGS. 6A and 6C, the hole HL is filled with an insulating layer to form the columnar portion HR having the pedestal PDr at the center. At this time, the memory hole MH formed in the memory region MR is covered with a mask film or the like (not illustrated). The mask film (not illustrated) is removed after forming the columnar portion HR. Incidentally, the columnar portion HR is formed in the stepped region SR through the same process although not illustrated in FIGS. 6A to 6C.

As illustrated in FIGS. 6A and 6B, the pillars PLa and PLb are formed in the stacked bodies LMas and LMbs. That is, the memory layer ME, such as the block insulating layer BK, the charge storage layer CT, and the tunnel insulating layer TN, the channel layer CN, and the core layer CR are formed in this order from the outer peripheral side of the memory hole MH. The channel layer CN is also formed at the bottom of the memory hole MH. As a result, the pillars PLa and PLb having the pedestals PD at the center are formed.

Incidentally, the order of the process of forming the pillars PLa and PLb and the process of forming the columnar portion HR can be exchanged. In such a case, the hole HL formed in the through contact region TPc and the like is covered with a mask film or the like (not illustrated) at the time of forming the pillars PLa and PLb.

Figure 7A:
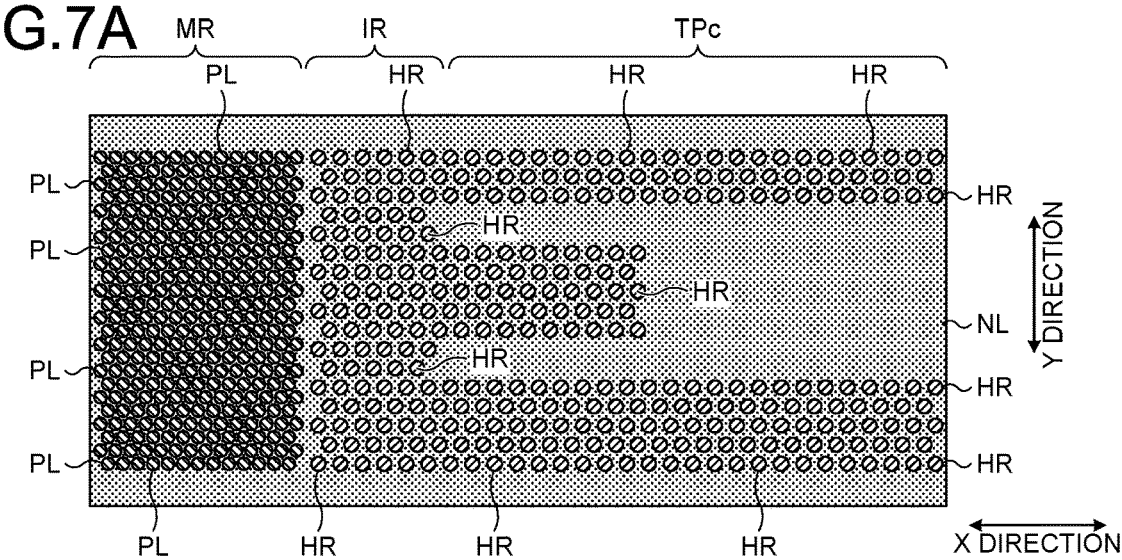
FIGS. 7A to 7C are views illustrating examples of the procedure of the method for manufacturing the semiconductor storage device according to the embodiment.
Figure 7B:
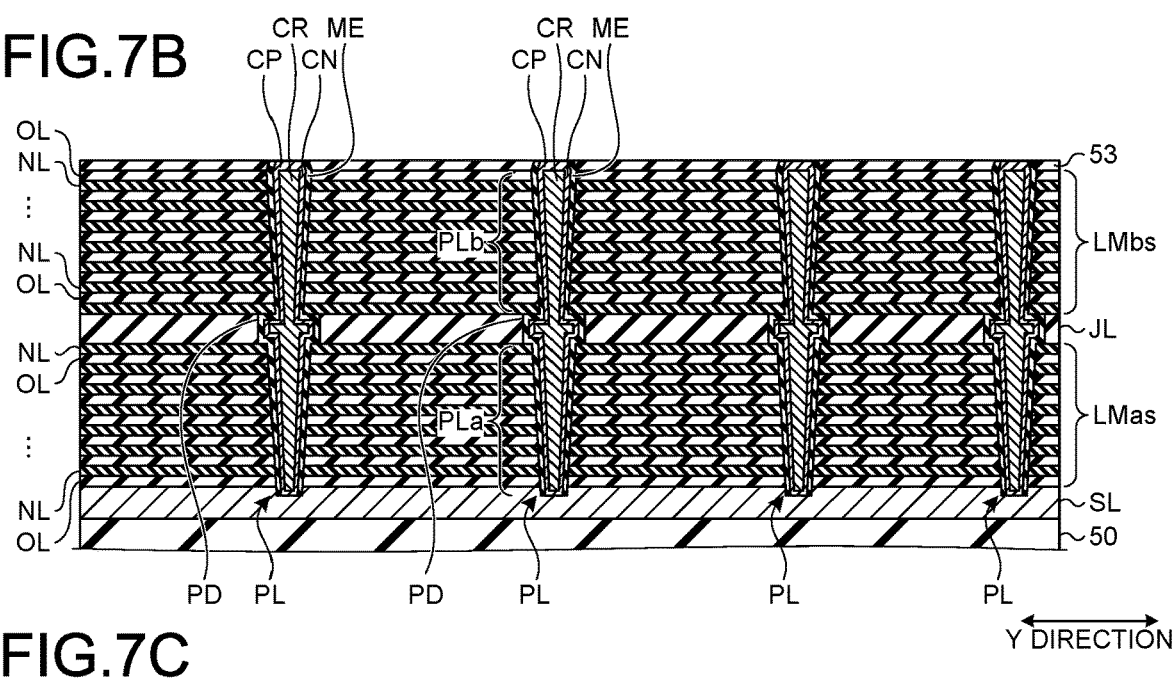

As illustrated in FIGS. 7A and 7B, an upper end of the core layer CR exposed on the top surface of the insulating layer 53 is etched back to form a recess in the upper end portion of the pillar PL. The recess is filled with an amorphous silicon layer, a polysilicon layer, or the like to form the cap layer CP on the core layer CR. As a result, the pillar PL having the cap layer CP is formed in the upper end portion.

Figure 7C:
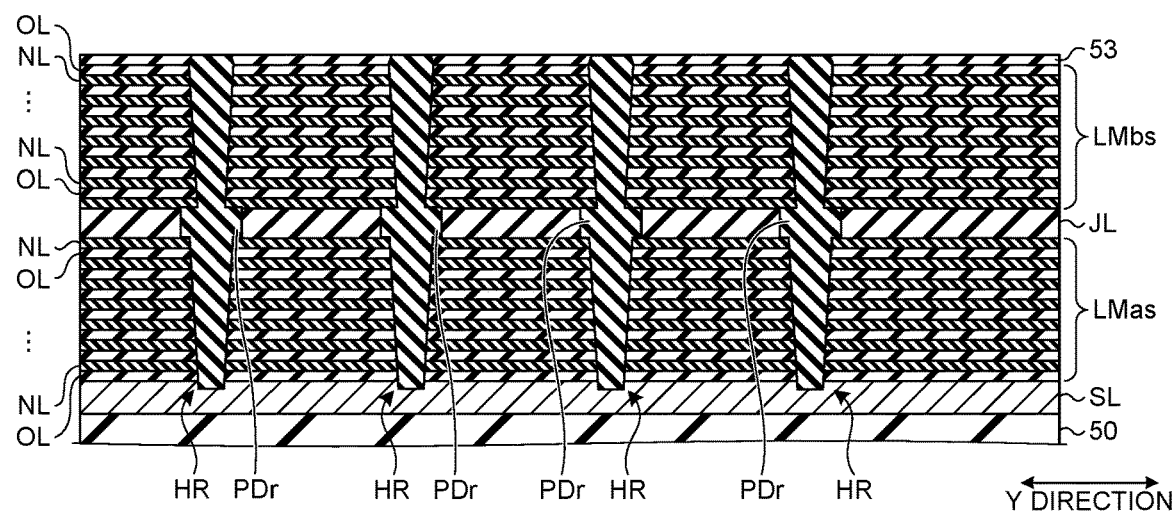

As illustrated in FIGS. 7A to 7C, the entire surface of the insulating layer 53 is etched back to thin the insulating layer 53 at the time of forming the cap layer CP.

Figure 8A:
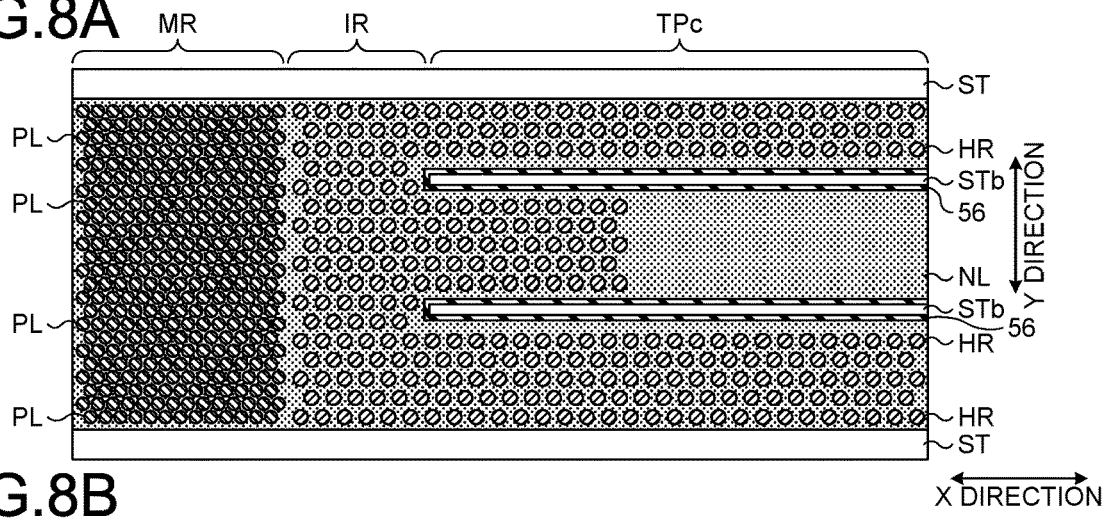
FIGS. 8A to 8C are views illustrating examples of the procedure of the method for manufacturing the semiconductor storage device according to the embodiment.
Figure 8B:
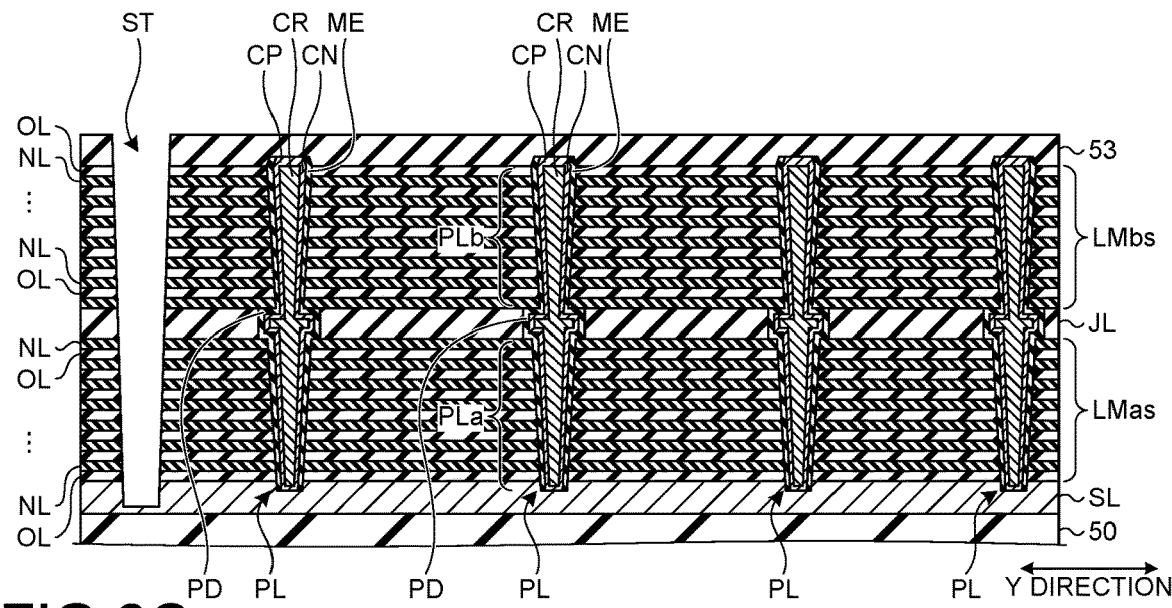
Figure 8C:
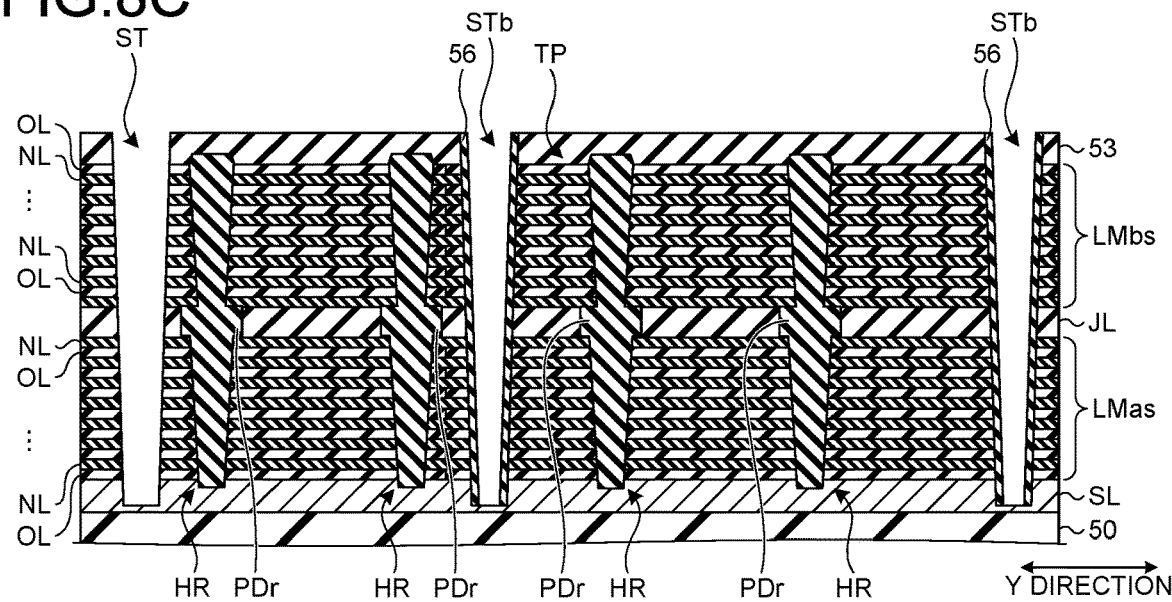

As illustrated in FIGS. 8A to 8C, the insulating layer 53 is formed again to cover the entire portion with the insulating layer 53. As a result, a state where the cap layer CP of the pillar PL protrudes inside the insulating layer 53, and an upper end portion of the columnar portion HR protrudes inside the insulating layer 53 is formed.

A slit ST, which penetrates the insulating layer 53, the stacked body LMbs, the junction layer JL, and the stacked body LMas and reaches the source line SL, is formed. The slit ST is formed so as to extend in the X direction over, for example, the memory region MR, the intermediate region IR, the through contact region TPc, and the stepped region SR (not illustrated).

In parallel with the formation of the slit ST, a slit STb, which penetrates the insulating layer 53, the stacked body LMbs, the junction layer JL, and the stacked body LMas and reaches the source line SL, is formed. The slit STb is locally formed in the through contact region TPc. An insulating layer 56 such as a $SiO_2$ layer is formed on a side wall of the slit STb.

Figure 9A:
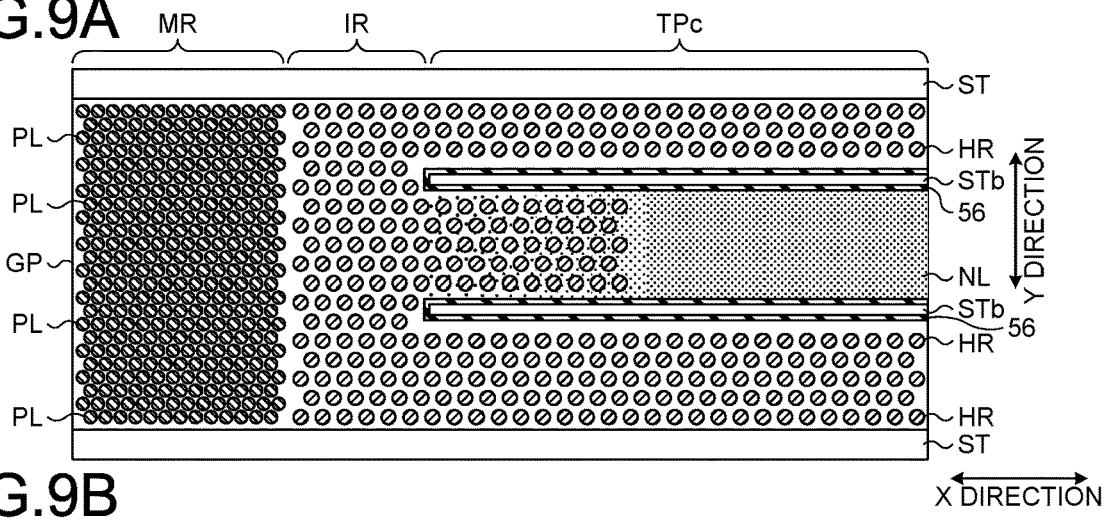
FIGS. 9A to 9C are views illustrating examples of the procedure of the method for manufacturing the semiconductor storage device according to the embodiment.
Figure 9B:
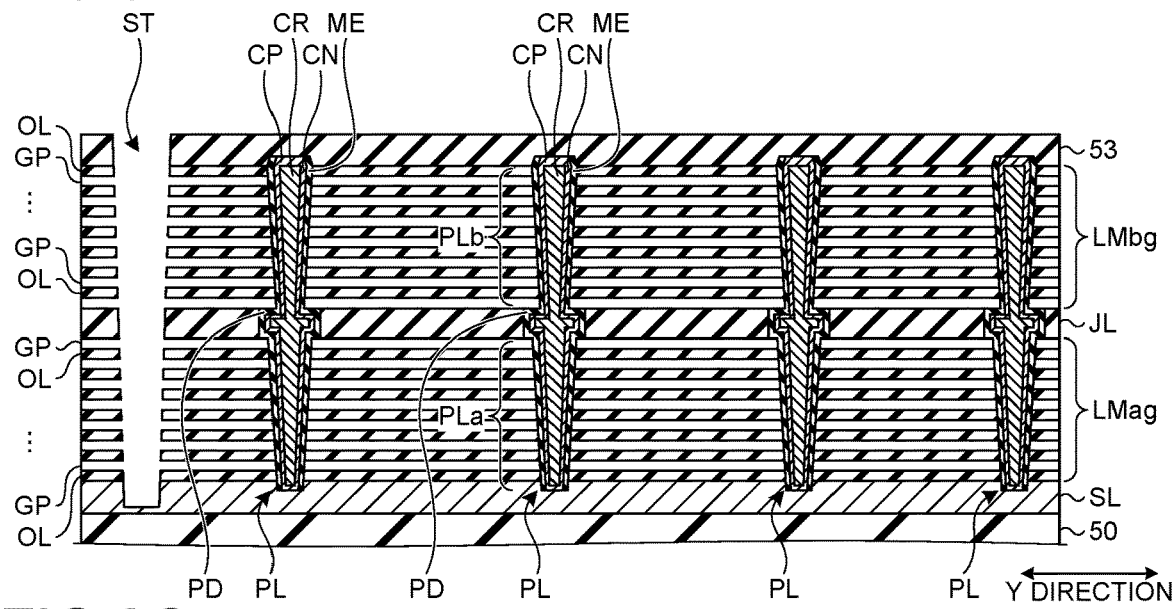
Figure 9C:
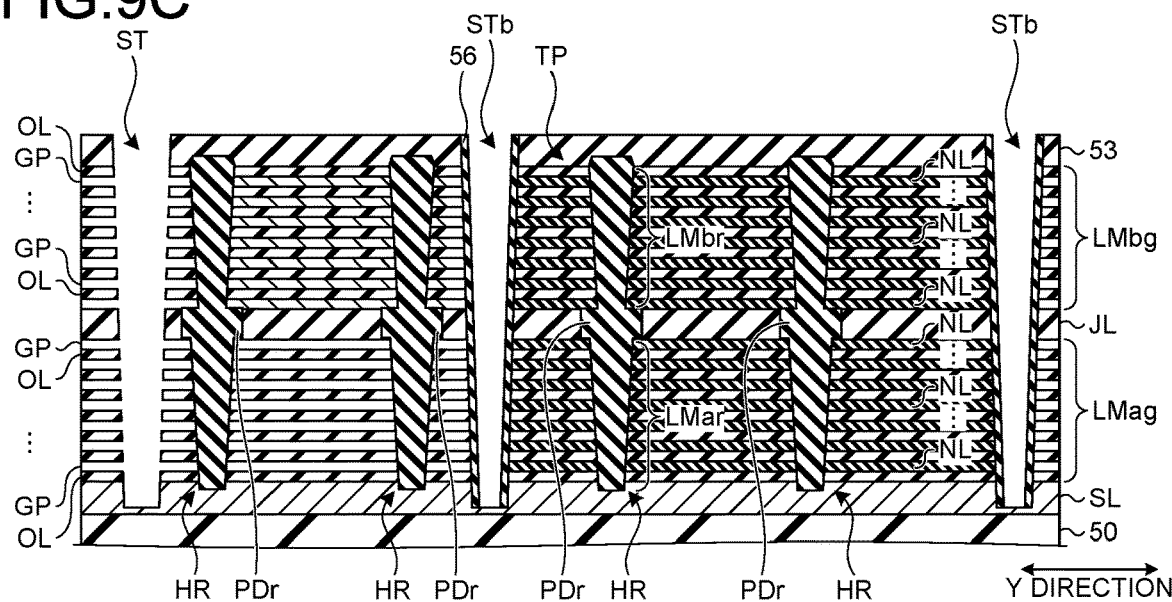

As illustrated in FIGS. 9A to 9C, the insulating layers NL in the stacked bodies LMas and LMbs are removed through the slit ST penetrating the stacked bodies LMas and LMbs. As a result, stacked bodies LMag and LMbg in which a gap GP is formed between the respective insulating layers OL are formed.

At this time, a chemical solution for removal of the insulating layer NL that has flowed in from the slit ST is inhibited from flowing into a region sandwiched between the slits STb by the slit STb having the insulating layer 56 on the side wall as illustrated in FIGS. 9A and 9C. Then, the process is stopped before the chemical solution or the like bypasses an end of the slit STb and flows into the above-described region far from the end of the slit STb (from the X-direction side), so that the insulating layer NL remains without being removed in the region between the two slits STb. As a result, the stacked bodies LMar and LMbr in which the insulating layer NL remains between the insulating layers OL are formed in the vicinity of the substantially center of the region between the slits STb.

However, a manufacturing difference occurs in the inflow distance of the chemical solution into the region sandwiched between the slits STb. Therefore, an reaching position of the chemical solution is likely to vary between one end of the plate-shaped portion BR in the X direction and the vicinity of the center position of the plate-shaped portion BR in the X direction. In this case, positions of ends of the stacked bodies LMar and LMbr in the X direction, which are portions where the stacked bodies LMas and LMbs remain, also vary between one end of the plate-shaped portion BR in the X direction and the vicinity of the center position of the plate-shaped portion BR in the X direction.

However, the process of removing the insulating layer NL is controlled such that at least the chemical solution flowing into the region sandwiched between the slits STb does not reach a position where the contact C4 is to be formed. In other words, the inflow distance of the chemical solution is controlled such that the positions of the ends of the remaining stacked bodies LMar and LMbr in the X direction do not recede from the position where the contact C4 is to be formed.

At this time, the stacked bodies LMag and LMbg, which are fragile structures having gaps GP, are supported by the pillars PL at the positions illustrated in FIG. 9B, and supported by the columnar portions HR at the positions illustrated in FIG. 9C and the stepped region SR (not illustrated).

Figure 10A:
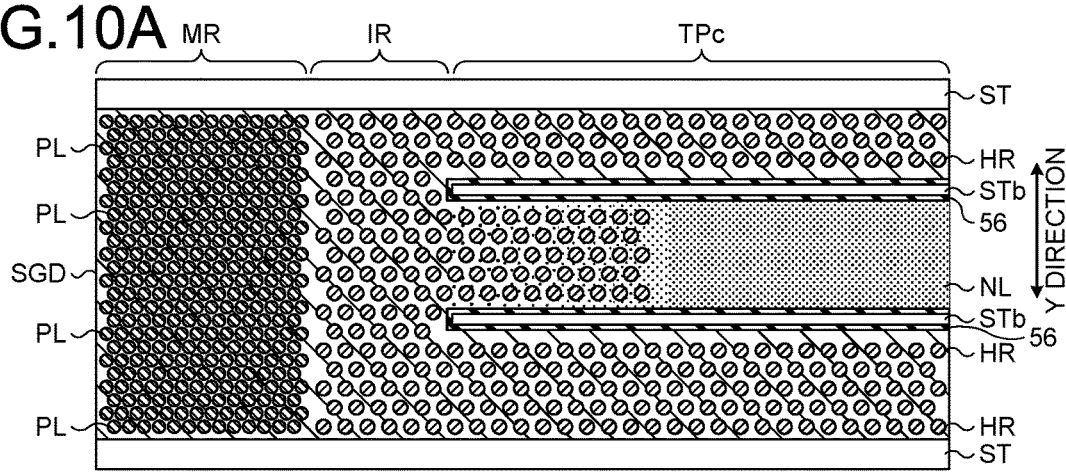
FIGS. 10A to 10C are views illustrating examples of the procedure of the method for manufacturing the semiconductor storage device according to the embodiment.
Figure 10B:
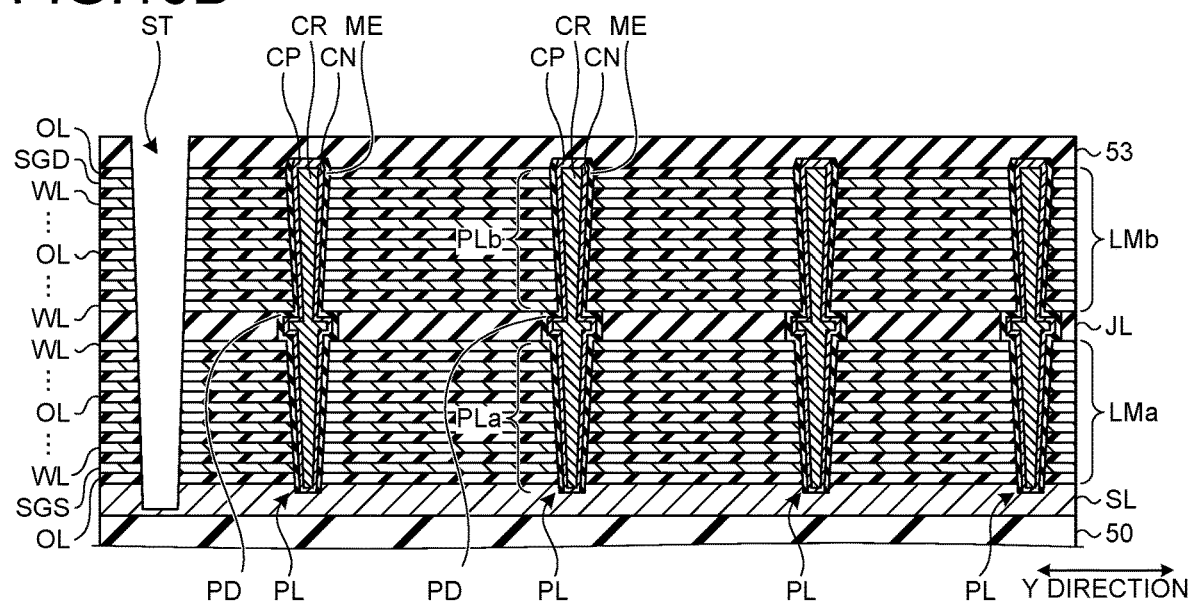
Figure 10C:
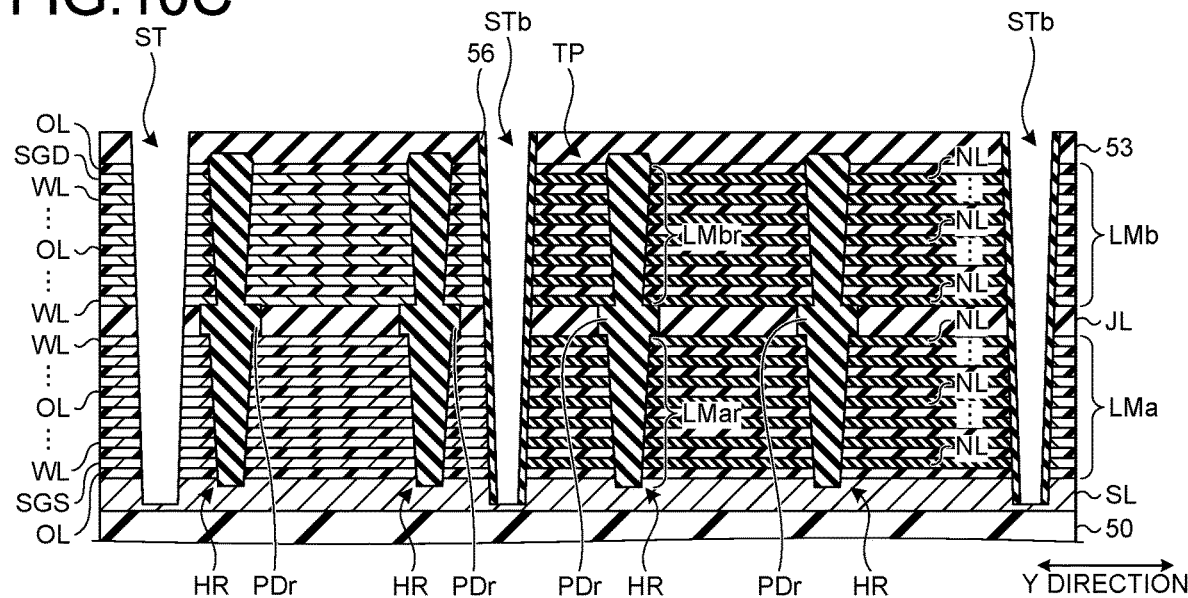

As illustrated in FIGS. 10A to 10C, the gaps GP in the above-described stacked bodies LMag and LMbg are filled with a conductive material such as tungsten or molybdenum through the slits ST penetrating the stacked bodies LMag and LMbg. As a result, the stacked bodies LMa and LMb in which conductive layers such as the word lines WL or the like are formed between the respective insulating layers OL are formed.

As illustrated in FIGS. 10A and 10C, the inflow of a gas for depositing a conductive layer such as a tungsten layer into the region sandwiched between the slits STb is also inhibited by the slit STb. As a result, the states of the stacked bodies LMar and LMbr having the insulating layers NL in the region sandwiched between the slits STb are maintained.

Here, there is a case where the end positions of the remaining stacked bodies LMar and LMbr in the X direction vary between one end of the plate-shaped portion BR in the X direction and the vicinity of the center position of the plate-shaped portion BR in the X direction as described above. In this case, the boundary between the stacked bodies LMa and LMb and the stacked bodies LMar and LMbr in the X direction also varies between one end of the plate-shaped portion BR in the X direction and the vicinity of the center position of the plate-shaped portion BR in the X direction. However, the stacked bodies LMa and LMb are prevented from being formed up to the position where the contact C4 is to be formed as described above.

As illustrated in FIGS. 9A to 10C, the process of replacing the insulating layer NL with the conductive layer such as the word line WL is sometimes called replacement.

Figure 11A:
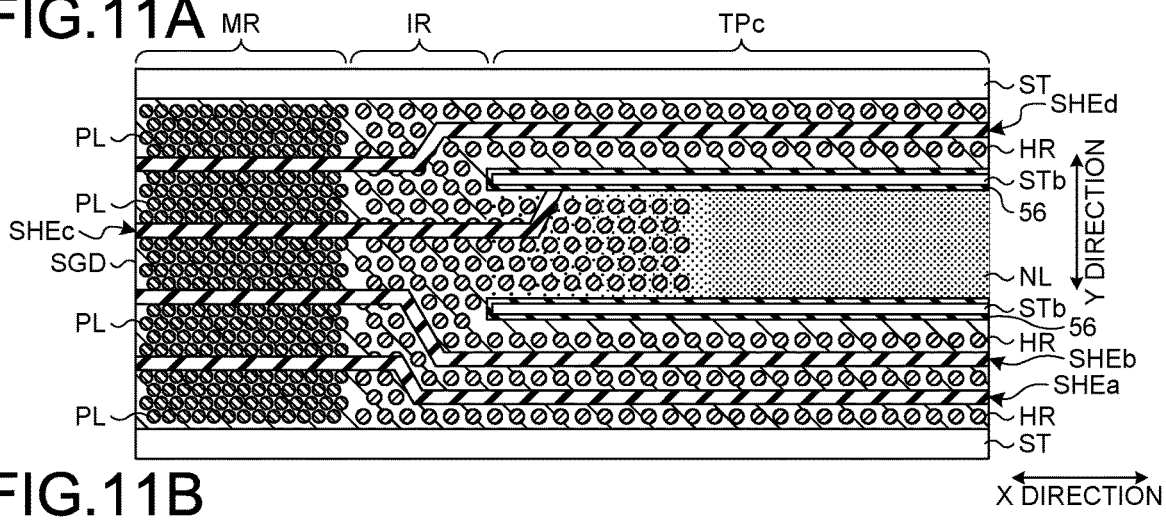
FIGS. 11A to 11C are views illustrating examples of the procedure of the method for manufacturing the semiconductor storage device according to the embodiment.
Figure 11B:
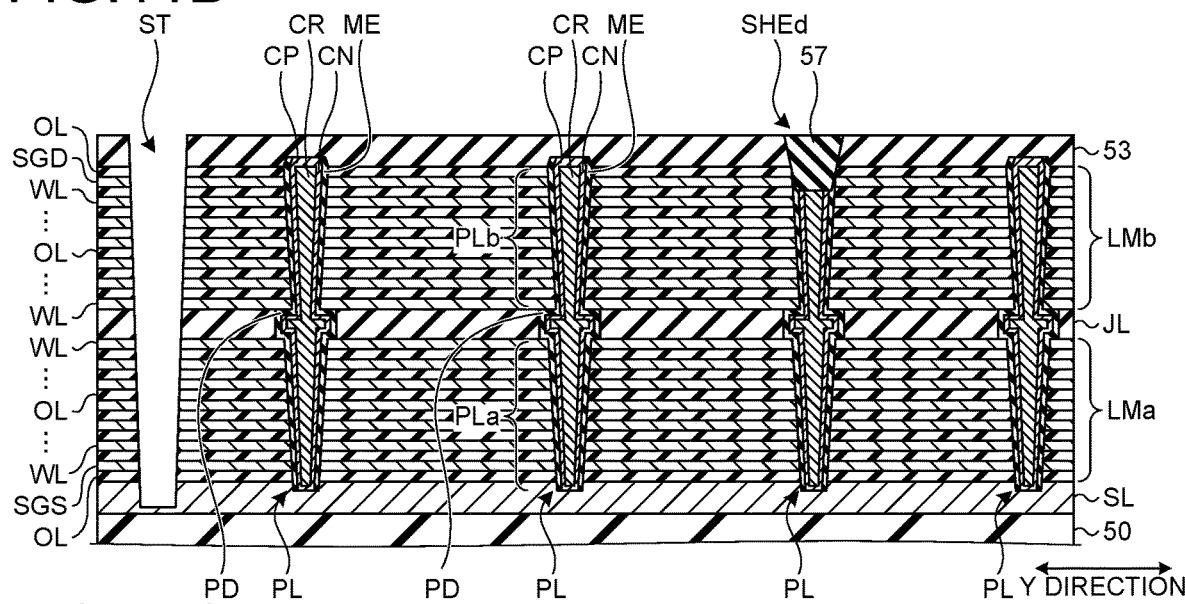
Figure 11C:
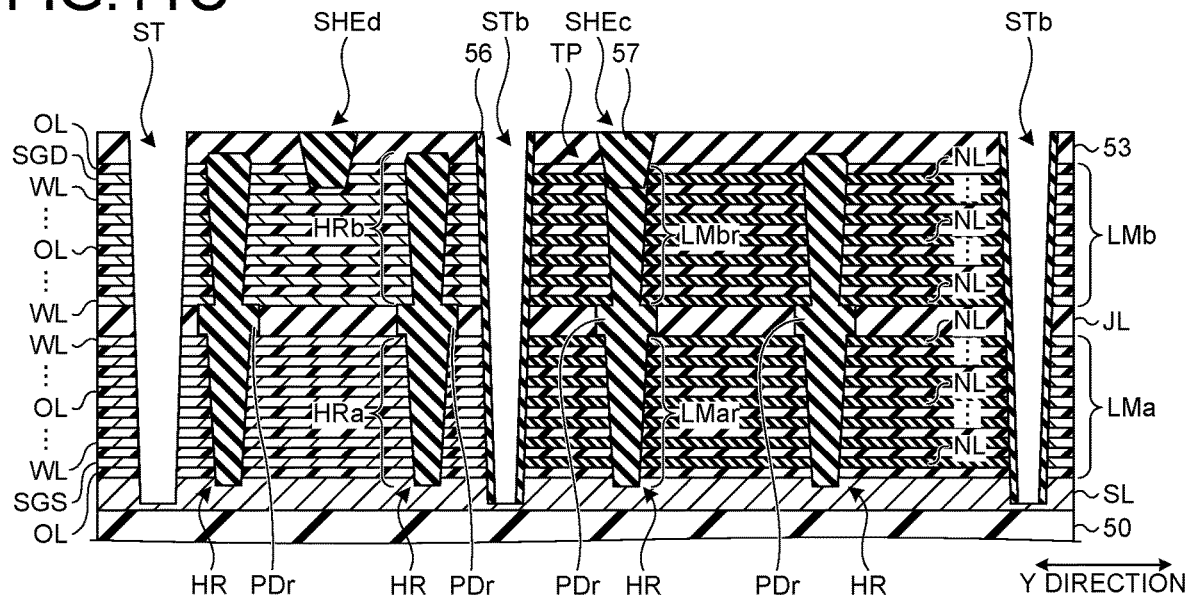

As illustrated in FIGS. 11A to 11C, the isolation layers SHEa to SHEd penetrating the insulating layer 53 and the uppermost conductive layer of the stacked body LMb are formed.

That is, a plurality of grooves are formed through the insulating layer 53 and the conductive layer on the uppermost layer of the stacked body LMb. At this time, the upper end portions of the pillars PL and the columnar portions HR located at positions overlapping with formation positions of these plurality of grooves disappear. These plurality of grooves are filled with the insulating layers 57 such as SiO$_2$ layers to form the isolation layers SHEa to SHEd.

Among the isolation layers SHEa to SHEd, the isolation layers SHEa, SHEb, and SHEd extend to regions on both sides of the through contact region TPc via the through contact region TPc. Both ends of the isolation layer SHEc are connected to and terminated by the slits STb in the through contact regions TPc arranged in both directions with the memory region MR interposed therebetween.

Thereafter, the slit STb is filled with an insulating layer to form the plate-shaped portion BR. In addition, the insulating layer 52 is formed on the side wall of the slit ST, and the inner side of the insulating layer 52 is filled with the conductive layer 20 to form the contact LI. However, the slit ST may be completely filled with an insulating layer or the like to form a structure having no function as a source line contact.

In addition, the contact C4, which penetrates the insulating layer 53, the stacked bodies LMar and LMbr, the junction layer JL, and the source line SL and is electrically connected to the transistor TR of the peripheral circuit CUA and the like, is formed. At this time, the stacked bodies LMar and LMbr, sufficient to form the contact C4, remain in the vicinity of the center position of the plate-shaped portion BR in the X direction as described above. Therefore, the contact C4 is formed while keeping the insulating property with respective to the surrounding conductive members and the like.

In addition, the plug CH, which penetrates the insulating layers 54 and 53 and is connected to the cap layer CP of the pillar PL, and the plug VO, which penetrates the insulating layer 54 and is connected to the respective contacts LI and C4, are formed after forming the insulating layer 54 covering the insulating layer 53. In addition, an upper layer wiring and the like connected to these plugs CH and VO are formed.

In addition, the contact CC (see FIG. 1B) connected to the word line WL of each step of the stepped region SR and an upper layer wiring connected to the contact CC are formed in the stepped region SR (not illustrated).

As described above, the semiconductor storage device 1 of the embodiment is manufactured.

In the manufacturing process of semiconductor storage devices such as the three-dimensional non-volatile memory, there is a case where an insulating layer is left in a part of a stacked body, for example, in order for passage of a contact connecting a peripheral circuit arranged on a substrate and an upper layer wiring and the like arranged above the stacked body.

Meanwhile, an upper layer of the stacked body is sometimes isolated into a plurality of select gate lines in order to control operations of a plurality of memory cells. In order to isolate the upper layer of the stacked body, for example, an isolation layer is formed from one end to the other end of the stacked body. Here, there is a case where the isolation layer is interrupted in a partial region due to the contact connecting the peripheral circuit and the upper layer wiring. Even in such a case, the upper layer of the stacked body can be isolated by connecting an end of the isolation layer to a portion of the stacked body where the insulating layer through which the contact is arranged is left.

However, there is a case where the portion of the stacked body where the insulating layer is left is formed to be large in order to make the end of the isolation layer reliably reach the portion of the stacked body where the insulating layer is left and untouch with the contact arranged on the portion of the stacked body. As a result, the overall size of the semiconductor storage device also increases.

On the other hands, when the end of the isolation layer does not reach the portion of the stacked body where the insulating layer is left due to a manufacturing difference at the time of forming the isolation layer or the like, it is difficult to completely isolate the upper layer of the stacked body, and some of the select gate lines are electrically connected to each other.

In order to solve these issues, for example, a technique of surrounding a formation region of the contact connecting the peripheral circuit and the upper layer wiring with plate-shaped members or the like can be considered. However, there is a case where a dimensional conversion difference in the plate-shaped members becomes large in a portion where the plate-shaped members are connected orthogonal to each other, which is not desirable.

According to the semiconductor storage device 1 of the embodiment, the isolation layer SHEc extends in the portions of the stacked bodies LMa and LMb in the X direction toward the stacked bodies LMar and LMbr, and is connected to one side surface of the two plate-shaped portions BR from the inner region between the two plate-shaped portions BR.

As a result, it is possible to more reliably isolate the conductive layers on the upper layers in the stacked bodies LMa and LMb into the select gate lines SGD. That is, regarding the select gate line SGD partitioned by the isolation layer SHEb and the isolation layer SHEc and being adjacent to the isolation layer SHEc on one side in the Y direction, and the select gate line SGD partitioned by the isolation layer SHEd and the isolation layer SHEc and being adjacent to the isolation layer SHEc on the other side in the Y direction, those select gate lines SGD are more reliably isolated by the isolation layer SHEc and the plate-shaped portion BR to which the isolation layer SHEc is connected.

Therefore, it is possible to electrically insulate the select gate line SGD partitioned by the isolation layer SHEb and the isolation layer SHEc, and the select gate line SGD partitioned by the isolation layer SHEd and the isolation layer SHEc more reliably, for example, even in the stacked body LMar and LMbr having a size with the end position in the X direction being closer to the center position of the plate-shaped portion BR than the bent portion SHEz of the isolation layer SHEc or the connection position between the isolation layer SHEc and the plate-shaped portion BR. Accordingly, the sizes of the stacked bodies LMar and LMbr can be suppressed to be small, and the overall size of the semiconductor storage device 1 can be reduced.

According to the semiconductor storage device 1 of the embodiment, the plate-shaped portion BR to which the isolation layer SHEc is connected and the other plate-shaped portion BR have the longitudinal direction in the X direction, and extend in the stacking direction of the stacked bodies LMar and LMbr, at the respective positions on both sides of the stacked bodies LMar and LMbr.

In this manner, the plate-shaped portions BR are arranged on both the sides of the stacked bodies LMar and LMbr in the Y direction without completely surrounding the stacked bodies LMar and LMbr, and thus, the plate-shaped portions BR do not have any orthogonal portions, and the dimensional conversion difference can be suppressed to be small.

According to the semiconductor storage device 1 of the embodiment, the isolation layer SHEc is connected to the side surface of the plate-shaped portion BR at an angle smaller than the right angle. As a result, the isolation layer SHEc and the plate-shaped portion BR do not connect orthogonal to each other, and a dimensional conversion difference between the isolation layer SHEc and the plate-shaped portion BR can be suppressed to a small value.

According to the semiconductor storage device 1 of the embodiment, the angle formed by the portion SHEx and the portion SHEy at the bent portion SHEz of the isolation layer SHEc is an obtuse angle. As a result, the portion SHEx and the portion SHEy do not connect orthogonal to each other, and the dimensional conversion difference in the isolation layer SHEc can be suppressed to a small value.

Incidentally, the isolation layer SHEc connected to the plate-shaped portion BR is arranged in the through contact region TPc arranged between the memory regions MR in the above-described embodiment. However, for example, in a case of adopting a configuration of inhibiting the replacement with the word line WL in another through contact region TPb or the like, a configuration in which a plate-shaped portion to inhibit the replacement and an isolation layer are connected may be adopted even in such a through contact region TPb or the like.

In the above-described embodiment, the semiconductor storage device 1 has a two-tier (two-stage) structure including the two stacked bodies LMa and LMb. However, the semiconductor storage device may have a structure of one tier or three tiers or more.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
   a first stacked body in which a plurality of conductive layers are stacked with a first insulating layer interposed between the conductive layers;
   a second stacked body in which a plurality of second insulating layers are stacked with the first insulating layer interposed between the second insulating layers, the second stacked body being surrounded by the first stacked body when viewed from a stacking direction of each layer of the first stacked body;
   first and second plate-shaped portions which extend in the stacking direction and a first direction intersecting the stacking direction and are arranged between the first stacked body and the second stacked body on both sides of the second stacked body in a second direction intersecting the stacking direction and the first direction, respectively;
   a pillar which extends in the stacking direction inside the first stacked body at a position separated from the first and second plate-shaped portions in the first direction, and includes memory cells formed at intersections with at least some of the plurality of conductive layers; and
   an isolation layer that penetrates at least an uppermost conductive layer among the plurality of conductive layers and isolates the uppermost conductive layer in the second direction, wherein
   the isolation layer extends in a portion of the first stacked body in the first direction toward the second stacked body, and is connected to a side surface of the first plate-shaped portion from a first region on an inner side of the first and second plate-shaped portions.

2. The semiconductor storage device according to claim 1, wherein
   the isolation layer is connected to be inclined to the first plate-shaped portion extending in the first direction.

3. The semiconductor storage device according to claim 1, wherein
   the isolation layer is arranged at a position between the first and second plate-shaped portions in the second direction in the first region.

4. The semiconductor storage device according to claim 1, wherein
the isolation layer includes:
a first portion extending, in the first direction, in a second region and an intermediate region between the first region and the second region, the second region being a region of the first stacked body in which the pillar is arranged;
a second portion extending toward the first plate-shaped portion in the first region; and
a bent portion that is bent from the first portion to the second portion.

5. The semiconductor storage device according to claim 4, wherein
an angle formed by the first portion and the second portion at the bent portion is an obtuse angle.

6. The semiconductor storage device according to claim 4, wherein
the bent portion is arranged in the intermediate region or the first region.

7. The semiconductor storage device according to claim 4, further comprising
a contact that is located between vicinities of centers of the first and second plate-shaped portions in the first direction, penetrates the second stacked body in the stacking direction, and electrically connects structures arranged on both sides of the second stacked body in the stacking direction, wherein
a boundary between the first and second stacked bodies in the first direction is located closer to the contact than a position of the bent portion.

8. The semiconductor storage device according to claim 7, wherein
the boundary is located closer to the contact than a position where the isolation layer is connected to the first plate-shaped portion.

9. The semiconductor storage device according to claim 1, further comprising
first and second structures which extend in the stacking direction and the first direction inside the first stacked body and divide the first stacked body in the second direction, respectively, at positions separated from the first and second plate-shaped portions on both sides of the first and second plate-shaped portions in the second direction.

10. The semiconductor storage device according to claim 9, wherein
the first and second plate-shaped portions are formed from an insulator, and the first and second structures are formed from a conductor having an insulator on a side wall.

11. A semiconductor storage device comprising:
a first stacked body in which a plurality of conductive layers are stacked with a first insulating layer interposed between the conductive layers;
a second stacked body in which a plurality of second insulating layers are stacked with the first insulating layer interposed between the second insulating layers, the second stacked body being surrounded by the first stacked body when viewed from a stacking direction of each layer of the first stacked body;
first and second plate-shaped portions which extend in the stacking direction and a first direction intersecting the stacking direction and are arranged between the first stacked body and the second stacked body on both sides of the second stacked body in a second direction intersecting the stacking direction and the first direction, respectively;
a pillar which extends in the stacking direction inside the first stacked body at a position separated from the first and second plate-shaped portions in the first direction, and includes memory cells formed at intersections with at least some of the plurality of conductive layers; and
an isolation layer that penetrates at least an uppermost conductive layer among the plurality of conductive layers, extends in the first direction from the first stacked body toward the second stacked body and is connected to a surface of the first plate-shaped portion facing the second plate-shaped portion.

12. The semiconductor storage device according to claim 11, wherein
the isolation layer is connected to be inclined to the first plate-shaped portion extending in the first direction.

13. The semiconductor storage device according to claim 11, wherein
the uppermost conductive layer through which the isolation layer penetrates is isolated in the second direction.

14. The semiconductor storage device according to claim 11, further comprising
a contact that is located between vicinities of centers of the first and second plate-shaped portions in the first direction, penetrates the second stacked body in the stacking direction, and electrically connects structures arranged on both sides of the second stacked body in the stacking direction, wherein
a boundary between the first and second stacked bodies in the first direction is located between one end of the first plate-shaped portion in the first direction and a position of the contact in the first direction.

15. The semiconductor storage device according to claim 14, wherein
the boundary is located closer to the contact than a position where the isolation layer is connected to the first plate-shaped portion.

16. The semiconductor storage device according to claim 11, wherein
the isolation layer has:
a first portion extending from the first stacked body toward the second stacked body;
a second portion extending from one end of the first portion close to the second stacked body toward the first plate-shaped portion; and
a bent portion that is bent from the first portion to the second portion.

17. The semiconductor storage device according to claim 16, wherein
an angle formed by the first portion and the second portion at the bent portion is an obtuse angle.

18. The semiconductor storage device according to claim 16, wherein
the bent portion is arranged in a region sandwiched by the first and second plate-shaped portions in the second direction.

19. The semiconductor storage device according to claim 11, further comprising
first and second structures which extend in the stacking direction and the first direction inside the first stacked body and divide the first stacked body in the second direction, respectively, at positions separated from the first and second plate-shaped portions on both sides of the first and second plate-shaped portions in the second direction.

20. The semiconductor storage device according to claim 19, wherein
the first and second plate-shaped portions are formed from an insulator, and the first and second structures are formed from a conductor having an insulator on a side wall.

* * * * *